(12) United States Patent
Na et al.

(10) Patent No.: US 11,451,733 B2
(45) Date of Patent: Sep. 20, 2022

(54) OPTOELECTRONIC DEVICE FOR REDUCING SIGNAL RESET NUMBER AND FRAME TIME

(71) Applicant: Artilux, Inc., Menlo Park, CA (US)

(72) Inventors: Yun-Chung Na, Hsinchu County (TW); Chien-Lung Chen, Hsinchu County (TW); Ming-Jay Yang, Hsinchu County (TW); Szu-Lin Cheng, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 211 days.

(21) Appl. No.: 16/886,765

(22) Filed: May 28, 2020

(65) Prior Publication Data
US 2020/0382736 A1    Dec. 3, 2020

Related U.S. Application Data

(60) Provisional application No. 62/854,990, filed on May 31, 2019.

(51) Int. Cl.
*H04N 5/378* (2011.01)
*H01L 27/146* (2006.01)
*H04N 5/369* (2011.01)
*H04N 5/376* (2011.01)

(52) U.S. Cl.
CPC ......... *H04N 5/378* (2013.01); *H01L 27/1461* (2013.01); *H01L 27/14636* (2013.01); *H04N 5/36965* (2018.08); *H04N 5/3765* (2013.01)

(58) Field of Classification Search
CPC . G01S 17/894; G01S 17/36; H01L 27/14636; H01L 27/1461; H04N 5/3765
See application file for complete search history.

(56) References Cited

U.S. PATENT DOCUMENTS 5,426,069 A * 6/1995 Selvakumar ...... H01L 29/66477
257/286
2020/0029047 A1 * 1/2020 Jin ....................... H04N 13/271

\* cited by examiner

*Primary Examiner* — Thanh Luu
(74) *Attorney, Agent, or Firm* — Fish & Richardson P.C.

(57) ABSTRACT

An optoelectronic device is provided. The optoelectronic device includes a photodetector including a light-absorption region, 2N control contact layers electrically coupled to the light-absorption region, and 2N readout contact layers electrically coupled to the light-absorption region, wherein N is a positive integer larger than or equal to 2.

17 Claims, 32 Drawing Sheets

| Sub-cycle | Signals | Different signal |
|---|---|---|
| A | $C_1^{0°}, C_2^{90°}, C_3^{180°}$, and $C_4^{270°}$ | $C_1^{0°}-C_3^{180°}$, and $C_2^{90°}-C_4^{270°}$ |
| B | $C_1^{180°}, C_2^{270°}, C_3^{0°}$, and $C_4^{90°}$ | $C_1^{180°}-C_3^{0°}$, and $C_2^{270°}-C_4^{90°}$ |

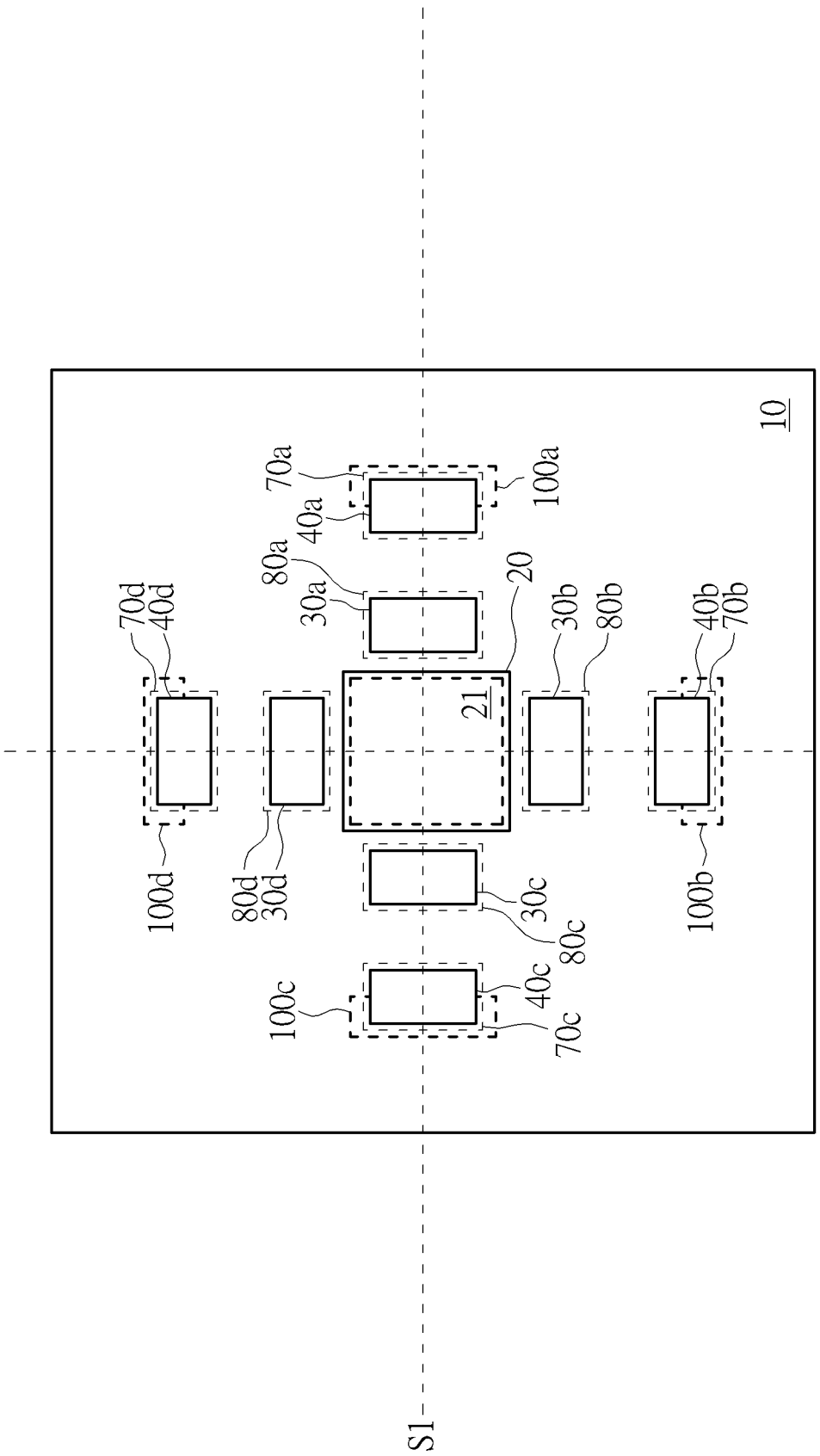

OPTOELECTRONIC DEVICE FOR REDUCING SIGNAL RESET NUMBER AND FRAME TIME

CROSS REFERENCE TO RELATED APPLICATIONS

This application claims the benefit of U.S. provisional application of U.S. 62/854,990, which was filed on May 31, 2019, and is incorporated herein by reference in its entirety.

BACKGROUND OF THE INVENTION

1. Field of the Invention

The present disclosure relates to an optoelectronic device, and more particularly, to a photodetector for detecting optical signals and convert the optical signals to electrical signals.

2. Description of the Prior Art

Optoelectronic device such as photodetector may be used to detect optical signals and convert the optical signals to electrical signals that may be further processed by another circuit.

Photodetectors may be used in consumer electronics products, image sensors, data communications, time-of-flight (TOF) ranging or imaging sensors, medical devices, and various other suitable applications. To enhance the signal quality, there is a need to reduce the noise offset and the signal-to-noise asymmetry.

SUMMARY OF THE INVENTION

According to an embodiment of the present disclosure, an optoelectronic device is provided. The optoelectronic device includes a photodetector including a light-absorption region, 2N control contact layers electrically coupled to the light-absorption region, and 2N readout contact layers electrically coupled to the light-absorption region, wherein N is a positive integer larger than or equal to 2.

According to another embodiment of the present disclosure, the light-absorption region is configured to convert an optical signal into an electrical signal.

According to another embodiment of the present disclosure, the light-absorption region includes a first axis of symmetry, one of the 2N control contact layers at one side of the first axis of symmetry is substantially symmetric to another one of the 2N control contact layers at the other side of the first axis of symmetry.

According to another embodiment of the present disclosure, the light-absorption region includes a second axis of symmetry, one of the 2N control contact layers at one side of the second axis of symmetry is substantially symmetric to another one of the 2N control contact layers at the other side of the second axis of symmetry; and the second axis of symmetry is substantially perpendicular to the first axis of symmetry.

According to another embodiment of the present disclosure, the optoelectronic device further includes 2M control signals electrically coupled to the photodetector and different from one another, wherein $2 \leq M \leq N$, M is a positive integer, and each of the 2M control signal controls at least one of the 2N control contact layers.

According to another embodiment of the present disclosure, each of the 2M control signals has a phase not overlapped by the phase of one another.

According to another embodiment of the present disclosure, each of the 2M control signals has a phase different from one another.

According to an embodiment of the present disclosure, an optoelectronic device is provided. The optoelectronic device includes a photodetector including a light-absorption region including a material including germanium, and 2N switches electrically coupled to the light-absorption region, wherein N is a positive integer larger than or equal to 2.

In some embodiments, the optoelectronic device further includes 2M control signals different from one another, wherein $2 \leq M \leq N$, M is a positive integer.

In some embodiments, each of the control signals includes a clock pulse. The phase difference between the clock pulse of x-th control signal and the clock pulse of (x+1)-th control signal is at least 360/2M degrees.

In one embodiment, a duty cycle of each of the clock pulses is equal to or less than 1/2M.

In one embodiment, the optoelectronic device further includes 2N charge storage units each electrically coupled to a respective switch.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 11A shows the top view of a pixel of an optoelectronic device according to an embodiment of the present disclosure.

DETAILED DESCRIPTION

Some phrases in the present specification and claims refer to specific elements; however, please note that the manufacturer might use different terms to refer to the same elements. Further, in the present specification and claims, the term "comprising" or "including" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Spatial terms, such as "above," "top," "bottom" and so forth, are indicated with respect to the orientation shown in the figures unless otherwise specified. It should be understood that the spatial descriptions used herein are for illustrative purposes only, and that practical implementations of the structures described herein can be spatially arranged in any orientation or manner, provided that the merits of embodiments of this disclosure are not deviated by such arrangement.

The present disclosure relates to an optoelectronic device. The design provided by the present disclosure involves at least four control signals controlling respective four control regions in a single pixel. The pixel may be a lock-in pixel for measuring depth.

Figures 1A, 1B:
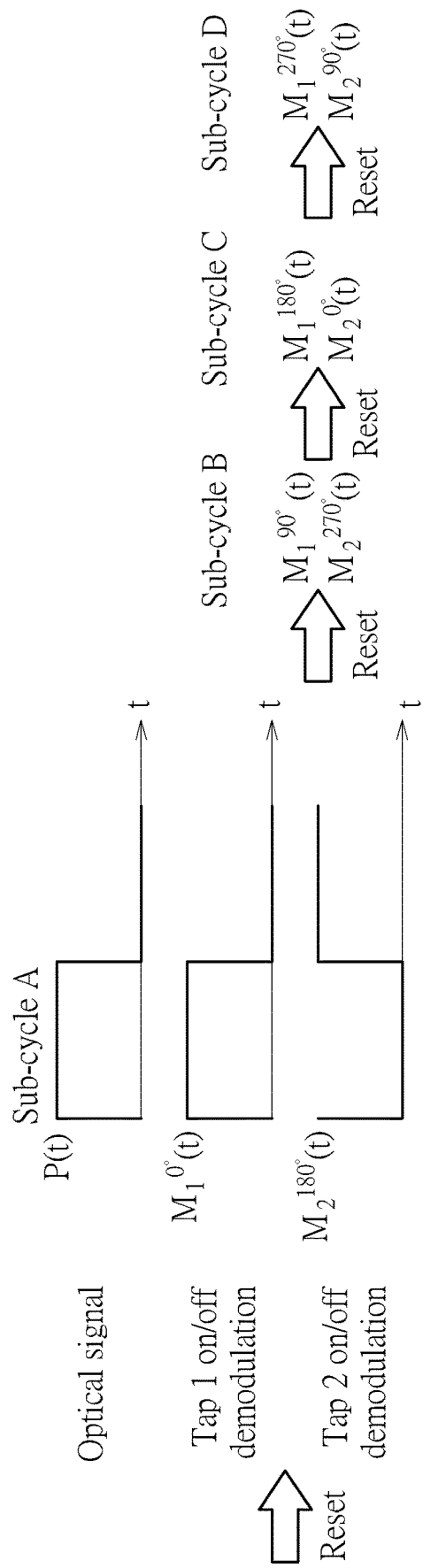
FIG. 1A illustrates a simplified timing diagram of the optical signal, on/off demodulation state of tap 1 and tap 2 controlled by the control signals.
FIG. 1B illustrates the phases of the control signals in different sub-cycles applicable to the 2-tap mentioned in FIG. 1A.

FIG. 1A illustrates a simplified timing diagram of the on/off demodulation of the taps controlled by the control signals, and FIG. 1B illustrates the phase of the controls signals in different sub-cycles applicable to the 2-tap on/off demodulation mentioned in FIG. 1A. As shown in the figures, in each sub-cycle, the phase of Tap 2 (the control region of a second switch) delays 180° from the phase of Tap 1 (the control region of the first switch)). While the phase of Tap 1 may be [0°, 90°, 180°, 270°], the corresponding phase of Tap 2 may be [90°, 180°, 270°, 0°]. A reset period controlled by a reset signal is between two adjacent sub-cycles. Note that the phase difference between Tap 1 and Tap 2 may create an in-phase or quadrature signal for depth and intensity calculations. For example, Sub-cycle A and Sub-cycle C create an in-phase signal for depth and intensity calculations, and Sub-cycle B and Sub-cycle D creates a quadrature signal for depth and intensity calculations. In this embodiment, 2*4 data sets for phase (which relates to depth) and amplitude (which relates to intensity) calculations are obtained. However, the number of the data sets is not limited to 2*4.

Instead of using 2-tap on/off demodulation switches in a pixel, the present disclosure further provides a pixel including at least four switches that are controlled by four control signals different from one another.

Figure 2A:
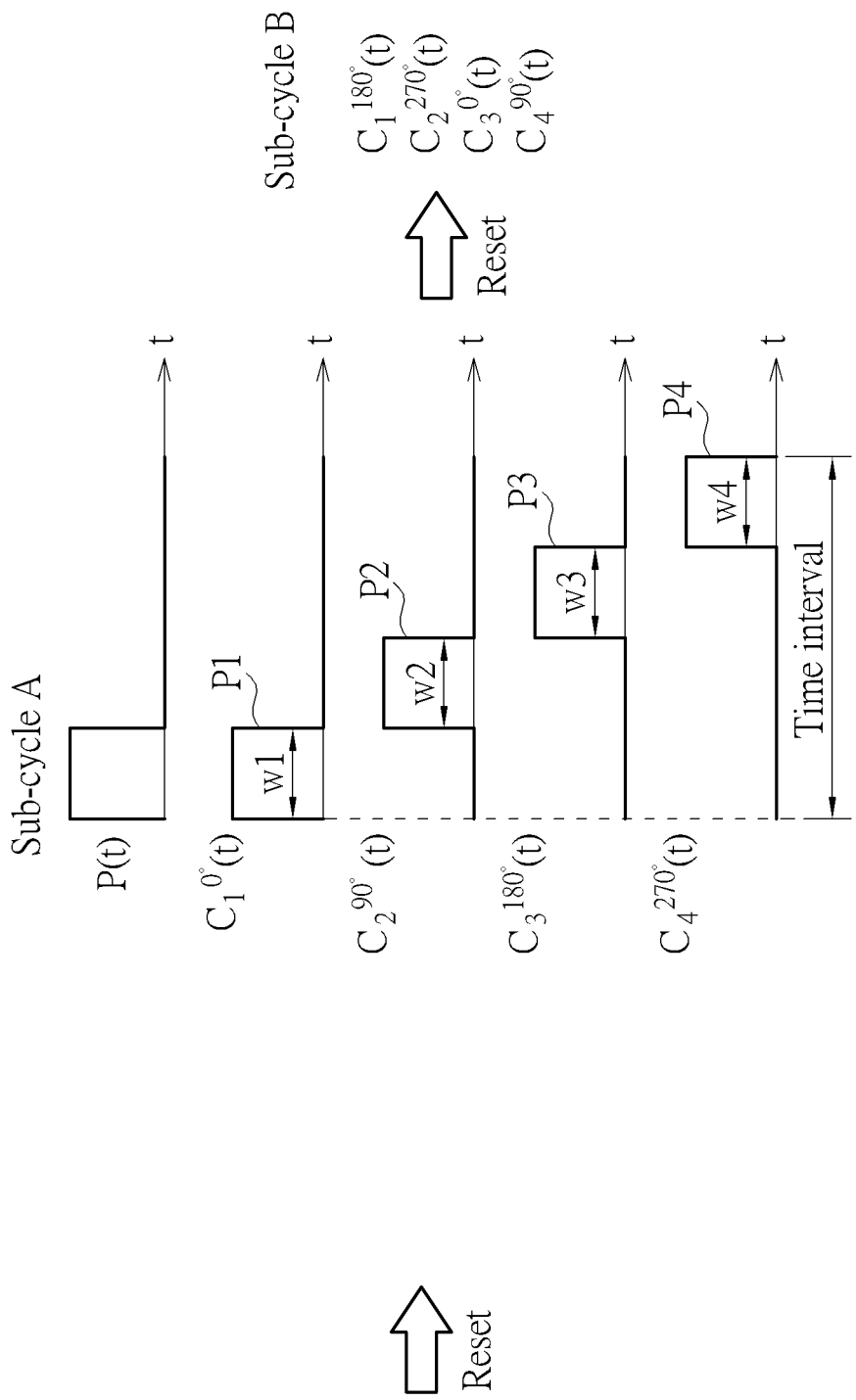
FIG. 2A illustrates a simplified timing diagram of the control signals.
Figure 2B:
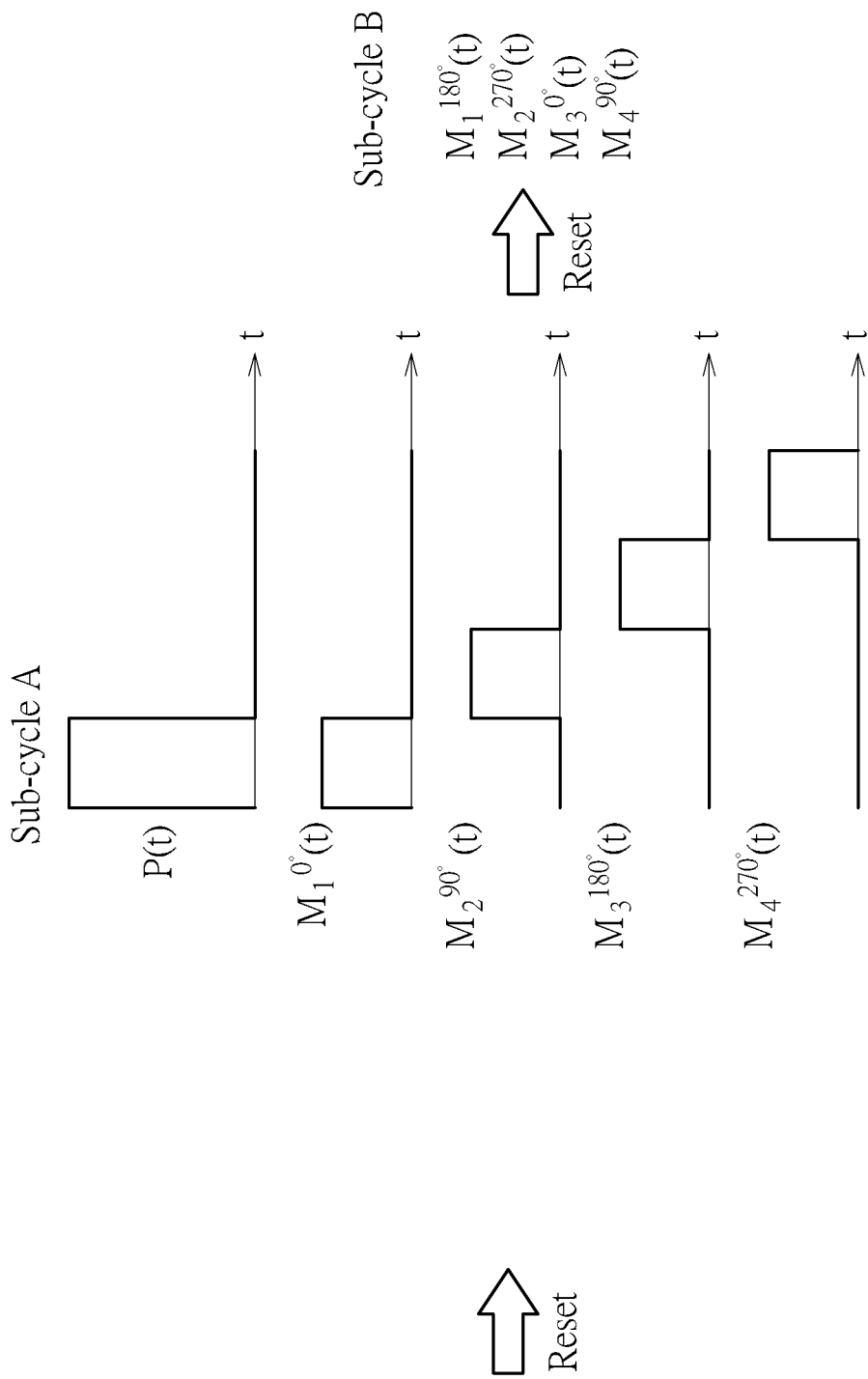
FIG. 2B illustrates a simplified timing diagram of the on/off of the taps controlled by the control signals.
Figures 2C, 3A:
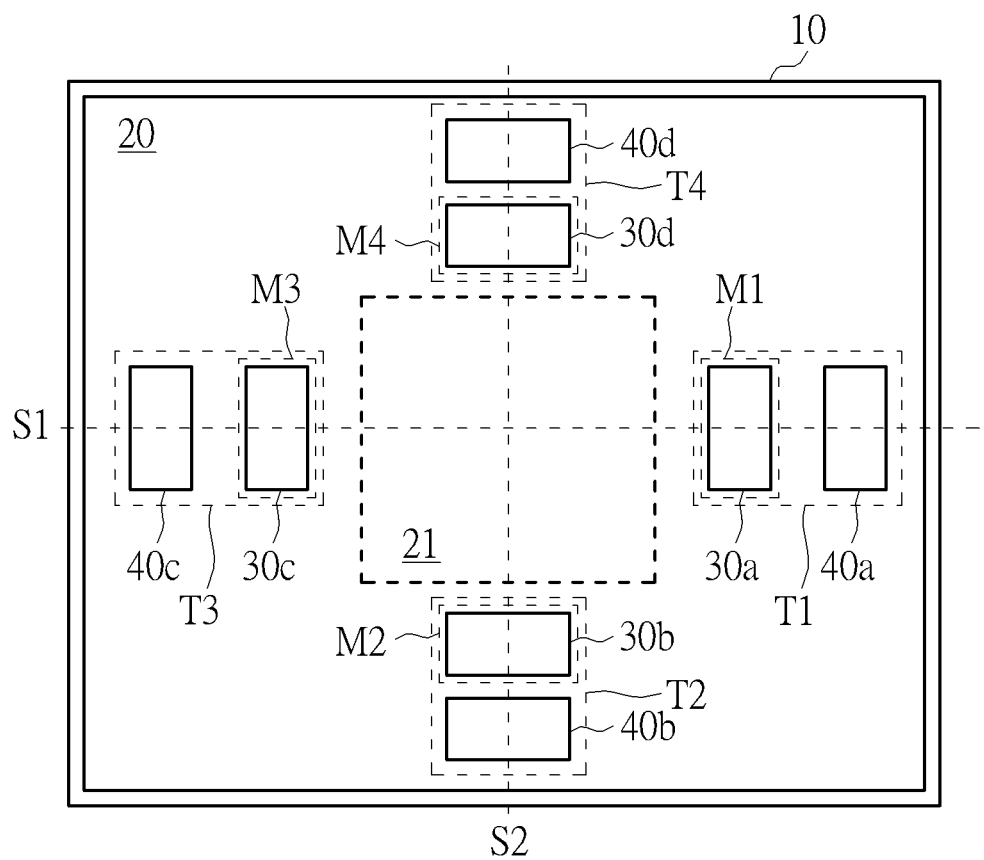
FIG. 2C illustrates the phases of the controls signals in different sub-cycles applicable to the taps in the photodetector mentioned in FIG. 2A.
FIG. 3A shows the top view of a pixel of an optoelectronic device according to an embodiment of the present disclosure.

FIG. 2A illustrates a simplified timing diagram of the control signals, and FIG. 2B illustrates a simplified timing diagram of the on/off of the taps controlled by the control signals. FIG. 2C illustrates the phase of the controls signals in different sub-cycles applicable to the taps in the photodetector mentioned in FIG. 2A. In the present embodiment, under the situation where a photodetector includes 4 switches, the 2×4 data set in the 2-tap scheme shown in FIG. 1A can be replaced with a 4×2 data set in the 4-tap scheme shown in FIG. 2A. As a result, by applying the scheme shown in FIG. 2A through FIG. 2C, some spatial resources (e.g. the tap portion of a pixel region) can be doubled, while some temporal resources (e.g. the reset number and frame time) are halved. As a result, the entire system can benefit from replacing the 2-tap scheme with the 4-tap scheme.

More specifically, in one embodiment, a pixel of an optoelectronic device includes a photodetector including 4 switches, wherein each of the switches includes a control region. The pixel further includes 4 different control signals, that is, a first control signal C1, a second control signal C2, a third control signal C3, and a fourth control signal C4, for controlling respective control region. The control signals C1, C2, C3 and C4 include clock pulses P1, P2, P3 and P4, respectively. In the same sub-cycle, the phase difference between the clock pulse of x-th control signal and the clock pulse of (x+1)-th control signal is at least 360/2M degrees. In some embodiments, in the same sub-cycle, the phase delay between the clock pulse of x-th control signal and the clock pulse of (x+1)-th control signal is at least 360/2M degrees. For example, M=2 suggests that the pixel of the optoelectronic device currently includes 4 control signals in total, and the phase delay between the clock pulse P1 of the first control signal C1 and the clock pulse P2 of second control signal C2 is about 90 degrees, the phase delay between the clock pulse P2 of the second control signal C2 and the clock pulse P3 of third control signal C3 is about 90 degrees, and the phase delay between the clock pulse P3 of the third control signal C3 and the clock pulse P4 of fourth control signal C4 is about 90 degrees.

In some embodiments, the duty cycle of the clock pulse may be equal to or less than ½M. For example, in some of the present embodiments where M=2, each of the duty cycles of the clock pulses P1, P2, P3 and P4 is equal to or less than ¼, wherein the duty cycle of the clock pulses P1, P2, P3 and P4=pulse width w1, w2, w3 and w4/(Time interval), wherein the time interval is measured from the start of the first pulse to the end of the last pulse in the same cycle, for example, referring to FIG. 2A, the first pulse is clock pulses P1, the last pulse is clock pulses P4. A reset period controlled by a reset signal is between two adjacent sub-cycles. The data obtained in each cycle constitutes a subframe. After a plurality of subframes are obtained, a final 2D or 3D frame can be obtained according to these subframes (e.g. 20 subframes, 40 subframes, 60 subframes or other numbers of subframes). For example, the final 2D or 3D frame can be obtained according to an average of the numbers of these subframes, an average of particular frames, or can be obtained by providing different weighting for each subframe. Similar calculations and approaches can be applied to 2D sensing as well. In some embodiments, the control signals are demodulation signals.

More specifically, in the sub-cycle A of FIG. 2B, Taps 1, 2, 3, and 4 M1, M2, M3 and M4 of the switches are turned on in a temporal sequence with [0% 90% 180% 270], based on the respective control signals as described in FIG. 2A.

However, other combinations are also applicable, e.g. there can be 4! combinations (4*3*2*1=24). Note that sub-cycle B shifts 180° from sub-cycle A, and for more details, the peak optical signal power shown in FIG. 2B is doubled in comparison with that shown in FIG. 1A (the height of the first row waveform of FIG. 2B is twice that of FIG. 2A), so that the average optical signal power may remain the same.

In addition, although the embodiment of FIG. 2A illustrates the waveform of the optical signal as a square wave and the duty cycle thereof is ¼, those settings can be modified in other embodiments. For example, in an exemplary implementation, the waveform of optical signal may be in a non-square shape, such as sinusoid signal. In another exemplary implementation, the optical signal has a duty cycle may be longer or shorter than ¼. Similarly, although the demodulation signal corresponding to FIG. 2A is square wave and the duty cycle thereof is also ¼, those settings can be modified in other embodiments. For example, in an exemplary implementation, the demodulation waveform may be in a non-square shape, such as sinusoid signal. In another exemplary implementation, the duty cycle of the demodulation may be longer or shorter than ¼. The present disclosure does not limit the 4-taps architecture of the photodetector to either in-phase or quadrature taps only. For example, in the sub-cycle A for the 1st sub-frame, the on-state of Taps 1/3 M1/M3 may be set as 0°/180°, and the on-state of Taps 2/4 M2/M4 may be set as 90°/270°. While in sub-cycle B for 2nd sub-frame, the on-state of Taps 1/3 M1/M3 may be set as 90°/270°, and the on-state of Taps 2/4 M2/M4 may be set as 0°/180°. Such kind of phase rotation solution can help reduce the mismatch of the taps in a pixel. In another example, the on-state of Taps 1/3 M1/M3 can be 0°/180° in the sub-cycle A and the sub-cycle B, and be on-state as 90°/270° in the next sub-cycle A and the sub-cycle B. Meanwhile, Taps 2/4 M2/M4 can be on-state as 90°/270° in the sub-cycle A and the sub-cycle B, and be 0/°180° at the next sub-cycle A and the sub-cycle B. Such kind of phase rotation solution can also help reduce the mismatch of taps in a pixel.

In the 4-tap scheme, the corresponding readout circuits could be doubled or partial doubled comparing with the 2-tap scheme. Here are some exemplary operation procedures:

1. 4-tap pixel→ corresponding 4 sets of charge storage units → 4 sets of readout circuits→ 4 sets of amplifier→ 2 sets of analog-to-digital converters (ADC).
2. 4-tap pixel→ corresponding 4 sets of charge storage units → 4 sets of readout circuits→ 4 sets of amplifiers→ 1 set of ADC with time division.

3. 4-tap pixel → corresponding 4 sets of charge storage units → 4 sets of readout circuit → 2 sets of amplifiers with time division → 1 set of ADC with time division.

4. 4-tap pixel → corresponding 4 sets of charge storage units → 2 sets of readout circuits with time division → 2 sets of amplifiers with time division → 1 set of ADC with time division.

In some embodiments, the charge storage unit may be a capacitor.

The 4 control signals can be generated outside of a pixel array, that is, 4 individual control signals passing through the whole pixel array are assigned to each tap of a single pixel. In another example, the 4 control signals can be generated inside a single pixel instead, by only 2 sets of clocks, e.g. 0° and 90°. Using certain digital logics at each single pixel can generate the 4 control signals without phase overlapping.

Figure 3B:
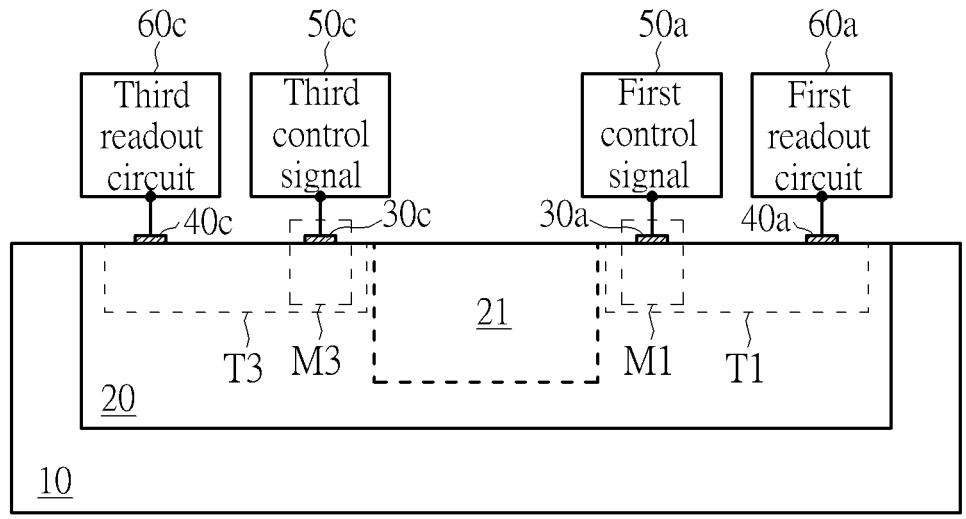
FIG. 3B shows the cross-sectional view of the pixel of the optoelectronic device along the first axis of symmetry S1 in FIG. 3A, wherein the first axis of symmetry S1 may be a horizontal symmetric axis.
Figure 3C:
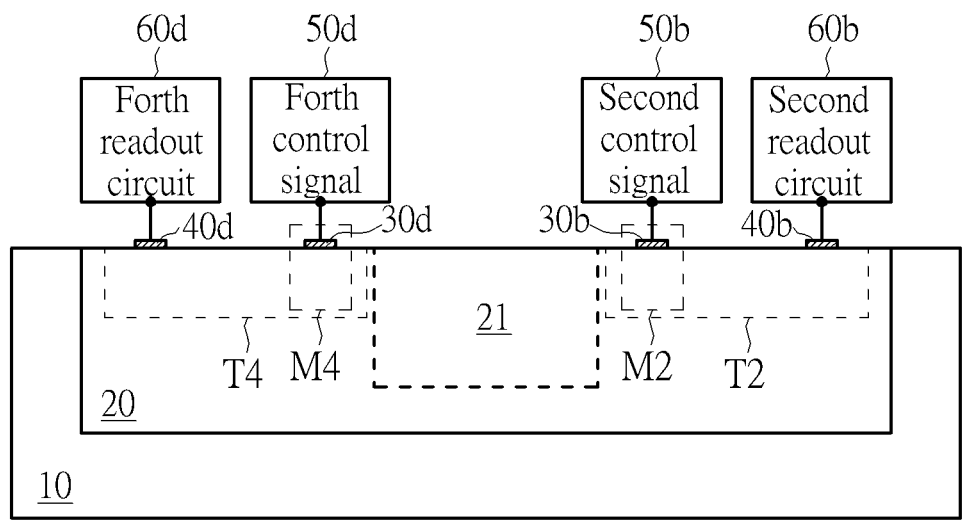
FIG. 3C shows the cross-sectional view of the pixel of the optoelectronic device along the second axis of symmetry S2 in FIG. 3A, which is perpendicular to the first axis of symmetry S1.

Please refer to FIG. 3A through FIG. 3C. FIG. 3A shows the top view of a pixel of an optoelectronic device according to an embodiment of the present disclosure. FIG. 3B shows the cross-sectional view of the pixel along a first axis of symmetry S1 in FIG. 3A, wherein the first axis of symmetry S1 may be a horizontal symmetric axis. FIG. 3C shows the cross-sectional view of the pixel along the second axis of symmetry S2 in FIG. 3A, which is substantially perpendicular to the first axis of symmetry S1.

The optoelectronic device includes a pixel including a substrate 10. The pixel further includes a photodetector including a light-absorption region 20 supported by the substrate 10. The photodetector further includes 2N switches electrically coupled to the same light-absorption region 20, wherein N is a positive integer larger than or equal to 2. In the present embodiment, the photodetector includes four switches electrically coupled to the same light-absorption region 20, that is, a first switch T1, a second switch T2, a third switch T3 and a fourth switch T4. The switches T1-T4 respectively include readout contact layers 40a-40d and control regions M1-M4, and the control regions M1-M4 respectively include control contact layers 30a-30d. In some embodiments, the readout contact layers 40a-40d and the control contact layers 30a-30d are positioned over the light-absorption region 20.

In some embodiments, the light-absorption region 20 includes a first axis of symmetry S1, one of the 2N control contact layers 30b at one side of the first axis of symmetry S1 is substantially symmetric to another one of the 2N control contact layers 30d at the other side of the first axis of symmetry S1. In some embodiments, the light-absorption region 20 further includes a second symmetric axis S2, and one of the 2N control contact layers 30a at one side of the second symmetric axis S2 is symmetric to another one of the 2N carrier control layers 30c at the other side of the second symmetric axis S2. The second symmetric axis S2 is substantially perpendicular to the first axis of symmetry S1.

The photodetector further includes a light-absorption area 21 in the light-absorption region 20 and defined by a light shield. The light-absorption area 21 is a virtual area receiving an optical signal incoming through an optical window of the light shield. The control regions M1-M4 can be modulation regions or demodulation regions. The 2N switches are electrically coupled to the same light-absorption area 21. In some embodiments, the distance between the two readout contact layers on opposite sides of the light-absorption area 21 is less than the width of the light-absorption region 20. For example, the distance between the two readout contact layers 40a, 40c is less than the width of the light-absorption region 20. In some embodiments, the distance between the two control contact layers on opposite sides of the light-absorption area 21 is less than the width of the light-absorption region 20. For example, the distance between the two control contact layers 30a, 30c, is less than the width of the light-absorption region 20.

In some embodiments, the 2N readout contact layers 40a-40d are symmetric relative to the light-absorption area 21. In some embodiments, the 2N control contact layers 30a-30d are symmetric relative to the light-absorption area 21.

As described in FIG. 2A through FIG. 2C, the optoelectronic device further includes 2M control signals electrically coupled to the photodetector, wherein the 2M control signals are different from one another, 2≤M≤N and M is a positive integer. Each of the 2M control signal controls at least one of the control regions, wherein the phase of each of 2M control signals is different from the phase of one another. In some embodiments, the phase of each of 2M control signals is partially overlapped by the phase of one another. In some embodiments, the phase of each of 2M control signals is not overlapped by the phase of one another. The control signals are for controlling the control regions for controlling the moving direction of the electrons or holes generated by the absorbed photons in the light-absorption region 20.

In some embodiments, the optoelectronic device may include at least 4 different control signals for controlling the 2N control regions, wherein each of the control signals controls respective control region.

As shown in FIG. 3A and FIG. 3B, the control contact layer 30a receives a first control signal 50a, the control contact layer 30c receives a third control signal 50c. The readout contact layer 40a is coupled to a first readout circuit 60a, and the readout contact layer 40c is coupled to a third readout circuit 60c.

As shown in FIG. 3A and FIG. 3C, the second symmetric axis S1 is substantially perpendicular to the first axis of symmetry S1. For example, the first axis of symmetry S1 can be a horizontal axis, and the second symmetric axis S2 can be a vertical axis. As shown in FIG. 3C, the control contact layer 30b is coupled to a second control signal 50b, the control contact layer 30d is coupled to a fourth control signal 50d. The readout contact layer 40b is coupled to a second readout circuit 60b, and the readout contact layer 40d is coupled to a fourth readout circuit 60c.

In the present disclosure, each of the readout circuits may be in a three-transistor configuration consisting of a reset gate, a source-follower, and a selection gate. In some embodiments, each of the readout circuits may be a circuit including four or more transistors, or any suitable circuitry for processing charges. For example, each of the first readout circuit 60a, the second readout circuit 60b, the third readout circuit 60c, and the fourth readout circuit 60d may be in a three-transistor configuration consisting of a reset gate, a source-follower, and a selection gate. The first readout circuit 60a, the second readout circuit 60b, the third readout circuit 60c, and the fourth readout circuit 60d may be a circuit including four or more transistors, or any suitable circuitry for processing charges. In some embodiments, the readout circuits may be fabricated on the substrate 10. In some embodiments, the readout circuits may be fabricated on another substrate and integrated/co-packaged with the light-absorption region 20 via die/wafer bonding or stacking. For example, the first readout circuit 60a, the second readout circuit 60b, the third readout circuit 60c, and the fourth readout circuit 60d may be fabricated on the substrate 10. In some other embodiments, the first readout circuit 60a, the second readout circuit 60b, the third readout circuit 60c, and the fourth readout circuit 60d may be fabricated on another substrate and integrated/co-packaged with the light-absorption region 20 via die/wafer bonding or stacking.

In some embodiments, each of the readout circuits includes a capacitor electrically coupled to the reset gate. For example, the first readout circuit 60a includes a first capacitor. The first capacitor is configured to store the photo-carriers collected by the carrier collection region 70a. In some embodiments, the first capacitor is electrically coupled to the reset gate of the first readout circuit 60a. In some embodiments, the first capacitor is between the source-follower of the first readout circuit 60a and the reset gate of the first readout circuit 60a. In some embodiments, the second readout circuit 60b includes a second capacitor. In some embodiments, the second capacitor is configured to store the photo-carriers collected by the carrier collection region 70b. In some embodiments, the second capacitor is electrically coupled to the reset gate of the second readout circuit 60b. In some embodiments, the second capacitor is between the source-follower of the second readout circuit 60b and the reset gate of the second readout circuit 60b.

The third readout circuit 60c includes a third capacitor. The third capacitor is configured to store the photo-carriers collected by the carrier collection region 70c. In some embodiments, the third capacitor is electrically coupled to the reset gate of the third readout circuit 60c. In some embodiments, the third capacitor is between the source-follower of the third readout circuit 60c and the reset gate of the third readout circuit 60c. In some embodiments, the fourth readout circuit 60d includes a fourth capacitor. In some embodiments, the fourth capacitor is configured to store the photo-carriers collected by the carrier collection region 70d. In some embodiments, the fourth capacitor is electrically coupled to the reset gate of the fourth readout circuit 60d. In some embodiments, the fourth capacitor is between the source-follower of the fourth readout circuit 60d and the reset gate of the fourth readout circuit 60d. Examples of the first to fourth capacitors may include, but are not limited to floating-diffusion capacitors, metal-oxide-metal (MOM) capacitors, metal-insulator-metal (MIM) capacitors, and metal-oxide-semiconductor (MOS) capacitors.

The first control signal 50a, the second control signal 50b, the third control signal 50c and the fourth control signal 50d are for controlling the control regions M1, M2, M3, M4 respectively, for controlling the moving direction of the electrons or holes generated by the absorbed photons in the light-absorption region 20. For example, when voltages are used, if the first control signal 50a is biased against the second control signal 50b, the third control signal 50c and the fourth control signal 50d, an electric field is created between the four portions right under the control contact layers 30a-30d, and free charges drift towards one of the four portions right under the readout contact layers 40a-40d depending on the direction of the electric field.

Referring to FIG. 2A and FIG. 3A through 3C, in some embodiments, the first control signal 50a, the second control signal 50b, the third control signal 50c and the fourth control signal 50d are continuous square wave signal during an integration operation. At beginning, that is, before the sub-cycle A, a reset signal is applied to reset the capacitors of the readout circuits 60a-60d to a preset voltage. The capacitors in the readout circuits 60a-60d will be discharged when the respective switch is turned-on and generates electrical signals based on the control signals 50a-50d. Each of the first control signal 50a, the second control signal 50b, the third control signal 50c and the fourth control signal 50d has phase offsets in different sub-cycles. In some embodiments, the first control signal 50a includes offsets of two phases (e.g. 0-degree, and 180-degree phases). The second control signal 50b includes offsets of two phases (e.g. 90-degree and 270-degree phases). The third control signal 50c includes offsets of two phases (e.g. 180-degree and 0-degree phases). The fourth control signal 50d includes offsets of two phases (e.g. 270-degree and 90-degree phases). The offsets of the two phases will be applied in turn. For example, the phase of the first control signal 50a is 0-degree during the sub-cycle A, and the phase of the first control signal 50a is 180-degree during the sub-cycle B. The phase of the second control signal 50b is 90-degree during the sub-cycle A, and the phase of the second control signal 50b is 270-degree during the sub-cycle B. The phase of the third control signal 50c is 180-degree during the sub-cycle A, and the phase of the third control signal 50c is 0-degree during the sub-cycle B. The phase of the fourth control signal 50d is 270-degree during the sub-cycle A, and the phase of the fourth control signal 50d is 90-degree during the sub-cycle B.

For example, if the optoelectronic device is configured to collect electrons, in the sub-cycle A, the voltage level of the first control signal 50a can be 1V, which suggests that the control region M1 is in a turned-on state, and the first switch T1 is switched on. The voltage level of the second control signal 50b can be 0V, which suggests that the control region M2 is in a turned-off state and the second switch T2 is switched off. The voltage level of the third control signal 50c can be 0V, which suggests that the control region M3 is in a turned-off state, and the third switch T3 is switched off. The voltage level of the fourth control signal 50d can be 0V, which suggests that the control region M4 is in a turned-off state, and the fourth switch T4 is switched off. In some embodiments, the first, second, third and fourth readout circuits 60a-60d may provide 1.5V to the readout contact layers 40a-40d, respectively. When the first switch T1 is switched "on" and the second switch T2, third switch T3, and fourth switch T4 are switched "off", the electrons drift toward the control region M1, that is the portion right under the control contact layer 30a, and the electric field between the portion right under the control contact layer 30a and the portion right under the readout contact layer 40a further carries the electrons to the portion right under the readout contact layer 40a. The first readout circuit 60a may then be enabled to process the charges collected by the portion right under the readout contact layer 40a. Before the pixel proceeds to the next sub-cycle, the capacitors of the readout circuits 60a-60d are reset to a preset voltage by a reset signal.

The optoelectronic device includes a pixel-array including multiple repeating pixels. In some embodiments, the pixel-array may be a one-dimensional or a two-dimensional array of pixels.

Figure 3D:
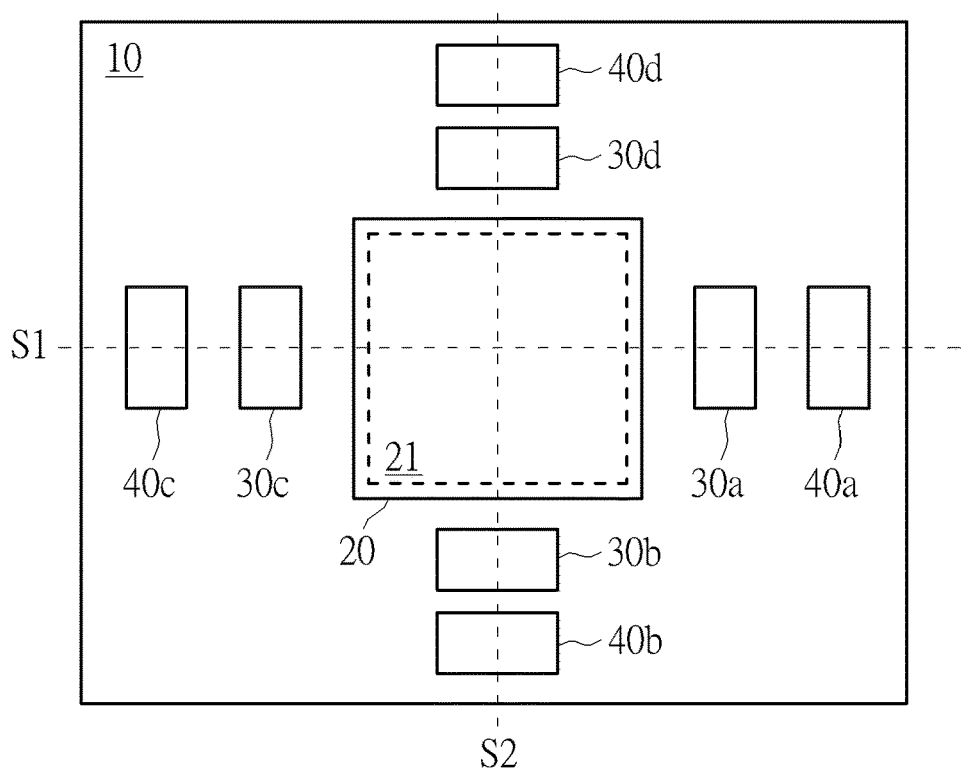
FIG. 3D shows the top view of a pixel of an optoelectronic device according to an embodiment of the present disclosure.

FIG. 3D shows the top view of a pixel of an optoelectronic device according to an embodiment of the present disclosure. As shown in FIG. 3D, the difference between FIGS. 3A and 3D is that the control contact layers 30a-30d and the readout contact layers 40a-40d in FIG. 3D are formed on the substrate 10. The distance between the two readout contact layers on opposite sides of the light-absorption area 21 is greater than the width of the light-absorption region 20. For example, the distance between the readout contact layers 40a, 40c is greater than the width of the light-absorption region 20. In some embodiments, the distance between the two control contact layers on opposite sides of the light-absorption area 21 is greater than the width of the light-absorption region 20. For example, the distance between the control contact layer 30a, 30c, is greater than the width of the light-absorption region 20.

Figure 4A:
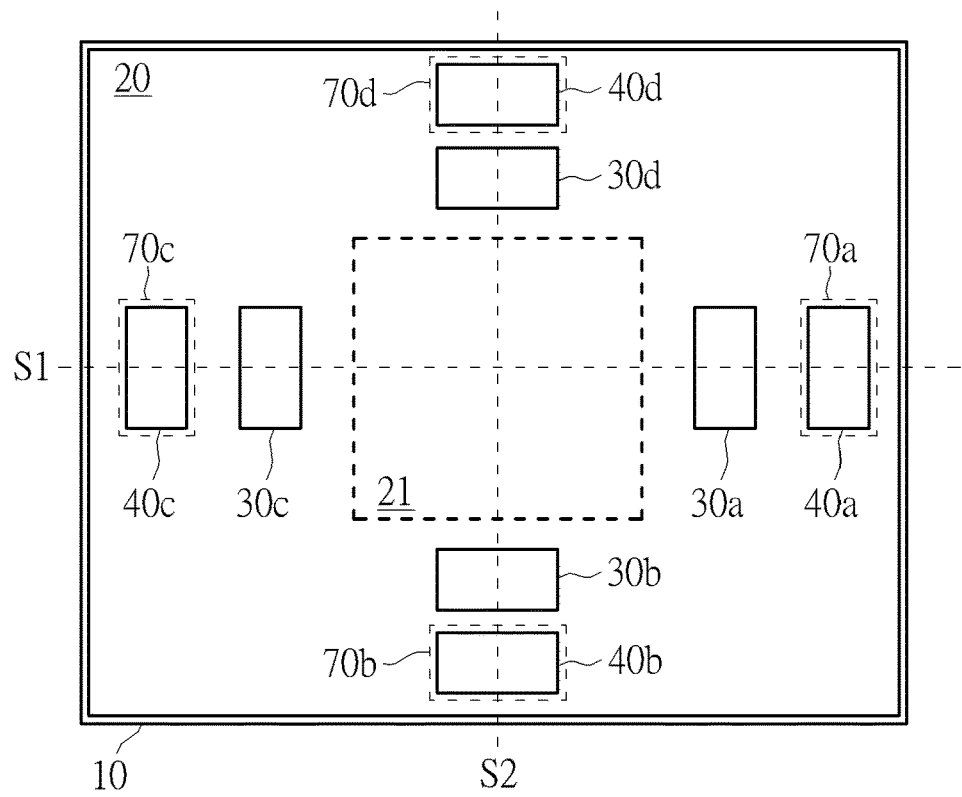
FIG. 4A shows a pixel of an optoelectronic device according to an embodiment of the present disclosure.
Figure 4B:
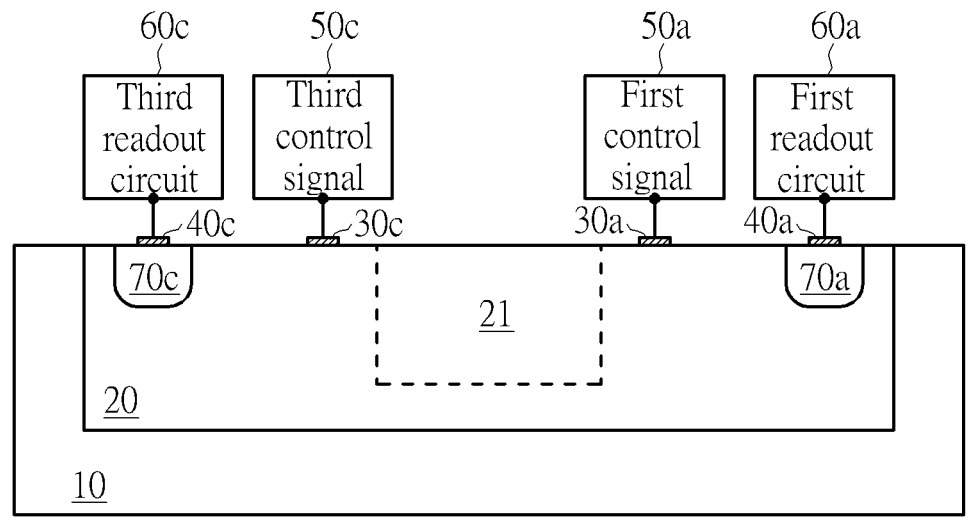
FIG. 4B shows the cross-sectional view along the first axis of symmetry S1 of FIG. 4A according to an embodiment of the present disclosure.
Figure 4C:
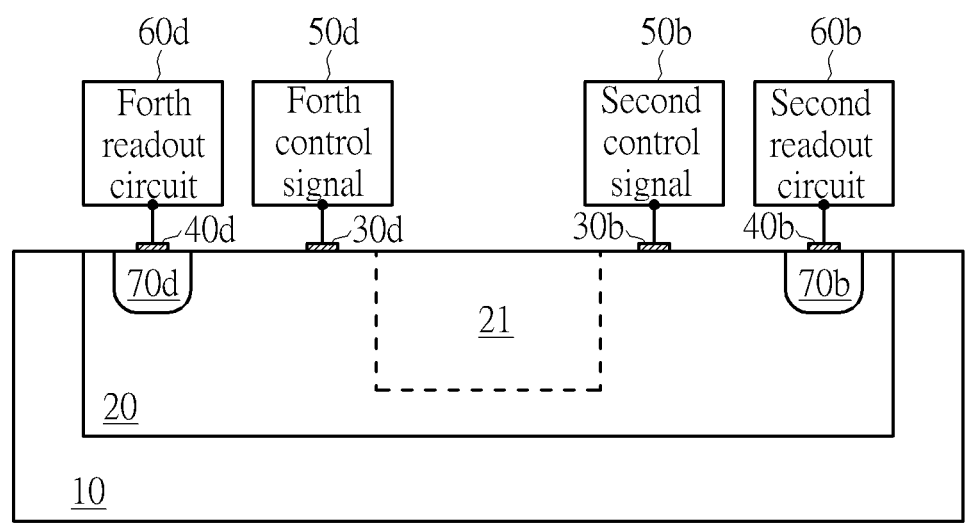
FIG. 4C shows the cross-sectional view along the second axis of symmetry S2 in FIG. 4A according to an embodiment of the present disclosure.

FIG. 4A shows a pixel of an optoelectronic device according to an embodiment of the present disclosure. FIG. 4B shows the cross-sectional view along the first axis of symmetry S1 of FIG. 4A according to an embodiment of the present disclosure. FIG. 4C shows the cross-sectional view along the second symmetric axis S2 in FIG. 4A according to an embodiment of the present disclosure. The pixel of an optoelectronic device in FIG. 4A-4C is similar to the pixel of an optoelectronic device in FIG. 3A-3C, where the difference is described below. Each of the switches further includes a carrier collection region under the readout contact layer. For example, as can be seen from FIG. 4A through FIG. 4C, the first switch T1 further includes a carrier collection region 70a under the readout contact layer 40a. The second switch T2 further includes a carrier collection region 70b under the readout contact layer 40b. The third switch T3 further includes a carrier collection region 70c under the readout contact layer 40c. The fourth switch T4 further includes a carrier collection region 70d under the readout contact layer 40d.

In some embodiments, the carrier collection regions 70a-70d are of a first conductivity type. In some embodiments, each of the carrier collection regions 70a-70d includes a first dopant and a doping profile. The peak dopant concentrations of the carrier collection regions 70a-70d depend on the material of the readout contact layers 40a-40d and the material of the light-absorption region 20, for example, may be between $5 \times 10^{18}$ cm$^{-3}$ to $5 \times 10^{20}$ cm$^{-3}$ to allow an Ohmic contact formed between the control contact layer and the light-absorption region 20. The carrier collection regions 70a-70d are for collecting the carriers generated from the light-absorption region 20, which are further proceeded by the readout circuit 60a-60d respectively based on the control of the first control signal 50a, the second control signal 50b, the third control signal 50c and the fourth control signal 50d.

Figure 4D:
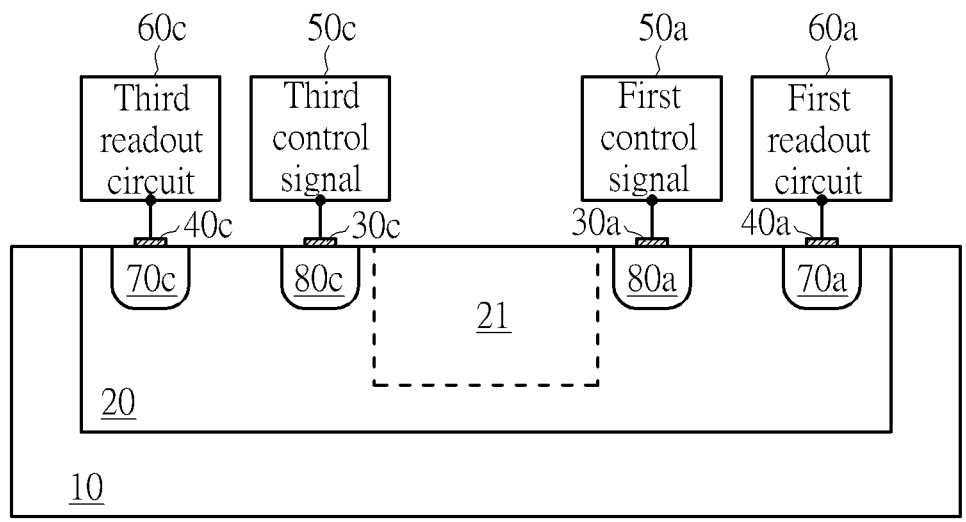
FIG. 4D shows the cross-sectional view along the first axis of symmetry S1 in FIG. 4A according to another embodiment of the present disclosure.
Figure 4E:
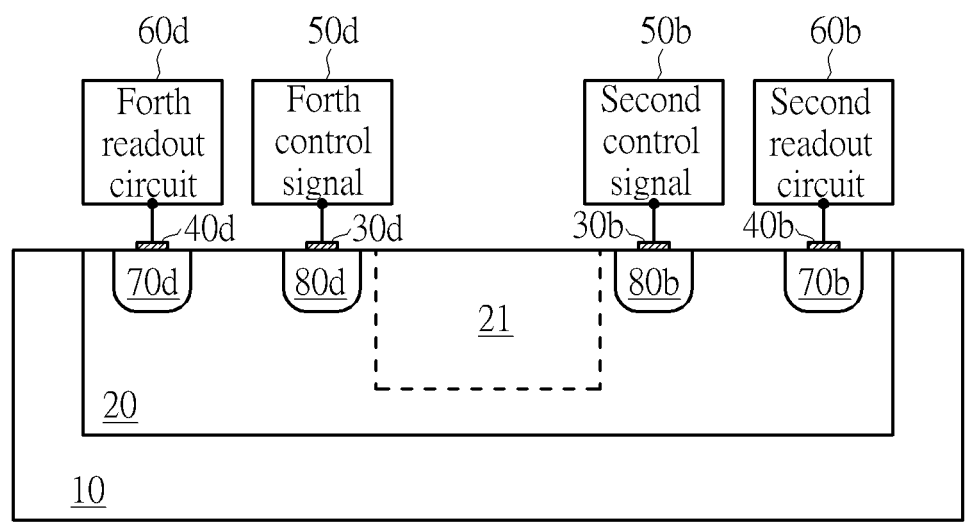
FIG. 4E shows the cross-sectional view along the second axis of symmetry S2 in FIG. 4A according to another embodiment of the present disclosure.

FIG. 4D shows the cross-sectional view along the first axis of symmetry S1 in FIG. 4A according to another embodiment of the present disclosure. FIG. 4E shows the cross-sectional view along the second symmetric axis S2 in FIG. 4A according to another embodiment of the present disclosure. The pixel of an optoelectronic device in FIG. 4D-4E is similar to the pixel of an optoelectronic device in FIG. 4B-4C, where the difference is described below. Each of the control regions of the switches further includes a carrier control region under the control contact layer. For example, the control region of the first switch T1 further includes a carrier control region 80a under the control contact layers 30a. The control region of the second switch T2 further includes a carrier control region 80b under the control contact layers 30b. The control region of the third switch T3 further includes a carrier control region 80c under the control contact layers 30c. The control region of the fourth switch T4 further includes a carrier control region 80d under the control contact layers 30d.

In some embodiments, the carrier control regions 80a-80d are of a second conductivity type different from the first conductivity type of the carrier collection regions 70a-70d. In some embodiments, each of the carrier control regions 80a-80d include a second dopant and a doping profile. The peak dopant concentrations of the carrier control regions 80a-80d depend on the material of the control contact layers 30a-30d and the material of the light-absorption region 20, for example, between $1 \times 10^{17}$ cm$^{-3}$ to $5 \times 10^{20}$ cm$^{-3}$. The carrier control regions 80a-80d form a Schottky or an Ohmic contact or a combination thereof with the control contact layers 30a-30d. The carrier control regions 80a-80d are for demodulating the carriers generated from the light-absorption region 20 based on the control of the first control signal 50a, the second control signal 50b, the third control signal 50c and the fourth control signal 50d.

For example, when the first switch T1 is switched "on" and other switches are switched "off", the electrons drift toward the carrier control region 80a, and the electric field between the carrier control region 80a and the carrier collection region 70a further carries the electrons to the carrier collection region 70a. The first readout circuit 60a may then be enabled to process the charges collected by the carrier collection region 70a.

Figure 4F:
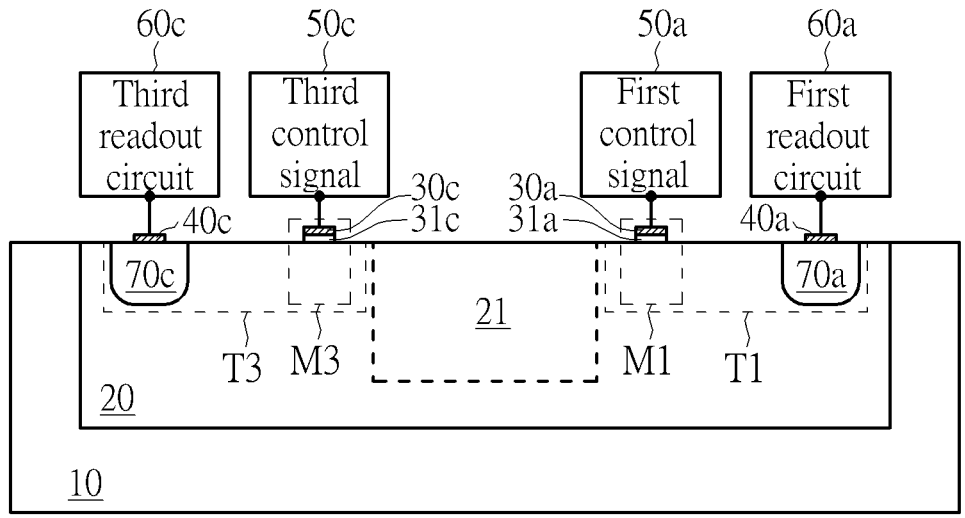
FIG. 4F shows the cross-sectional view along the first axis of symmetry S1 in FIG. 4A according to another embodiment of the present disclosure.
Figure 4G:
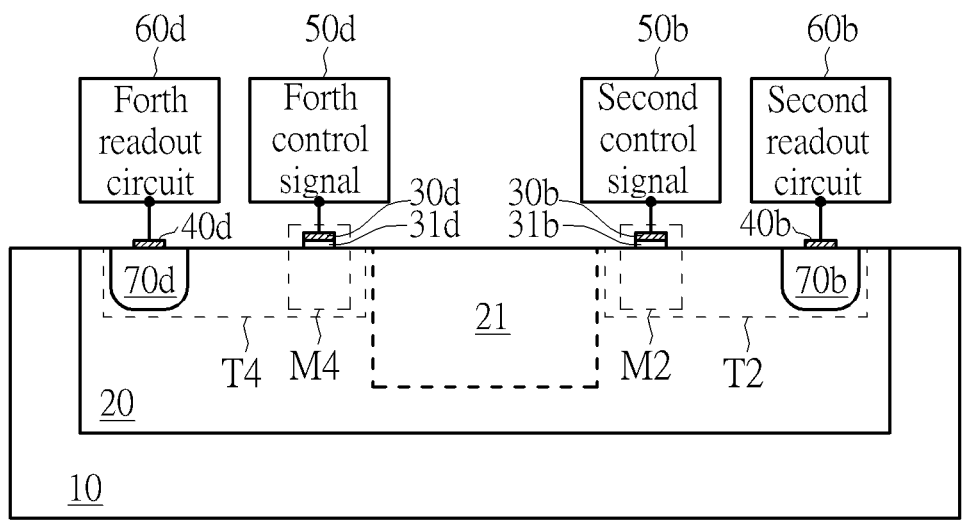
FIG. 4G shows the cross-sectional view along the second axis of symmetry S2 in FIG. 4A according to another embodiment of the present disclosure.

FIG. 4F shows the cross-sectional view along the first axis of symmetry S1 in FIG. 4A according to another embodiment of the present disclosure. FIG. 4G shows the cross-sectional view along the second symmetric axis S2 in FIG. 4A according to another embodiment of the present disclosure. Some features of this embodiment similar/identical to those of the embodiment of 4B and 4C are omitted here for brevity. As shown in FIG. 4F, the control region M1 of the first switch T1 further includes a dielectric layer 31a between the control contact layer 30a and the light-absorption region 20, and the control region M3 of the third switch T3 further includes a dielectric layer 31c between the control contact layer 30c and the light-absorption region 20. As shown in FIG. 4G, the control region M2 of the second switch T2 further includes a dielectric layer 31b between the control contact layer 30b and the light-absorption region 20, and the control region M4 of the fourth switch T4 further includes a dielectric layer 31d between the control contact layer 30d and the light-absorption region 20.

In some embodiments, the dielectric layers 31a-31d may be a continuous layer covering an upper surface and side surfaces of the light-absorption region 20, and covers a portion of an upper surface of the substrate 10 on which the light-absorption region 20 is formed. The dielectric layers 31a-31d may be consisted of a Complementary Metal-Oxide-Semiconductor (CMOS) process compatible material (CPCM), such as amorphous silicon, polysilicon, epitaxial silicon, aluminum oxide family (e.g. AlxOy such as Al2O3), silicon oxide family (e.g. SixOy such as SiO2), Ge oxide family (e.g. GeOx such as GeO2), germanium-silicon family (e.g. Ge0.4Si0.6, etc.), silicon nitride family (e.g. SixNy such as Si3N4), high-k materials (e.g. HfOx, ZnOx, LaOx, LaSiOx, YxOy such as Y2O3, TixOy such as TiO2), and any combination of the above. The presence of the dielectric layers 31a-31d over the surfaces of the absorption control region may have various beneficial effects. For example, the dielectric layers 31a-31d may act as a surface passivation layer to the absorption region, which may reduce dark current or leakage current generated by defects present at the surface of the absorption region. In the case of a germanium (Ge) or a germanium-silicon (GeSi) light-absorption region, the surface defects may be a significant source of dark current or leakage current, which contributes to an increased noise level of the photocurrent generated by the optoelectronic device. By forming the dielectric layers 31a-31d over the surfaces of the absorption region, the dark current or leakage current may be reduced, thereby reducing the noise level of the optoelectronic device. While in another example, the dielectric layers 31a-31d may modulate a Schottky barrier level between a contact formed on the optoelectronic device, the light-absorption region 20 and/or the substrate 10. In one embodiment, the dielectric layers 31a-31d may be layers separated from one another. In some embodiments, the dielectric layers 31a-31d prevents direct current conduction between the control contact layers 30a-30d and the light-absorption region 20 or the substrate 10, but allows an electric field to be established within the light-absorption region 20 in response to the control of the first control signal 50a, the second control signal 50b, the third control signal 50c and the fourth control signal 50d.

Figure 4H:
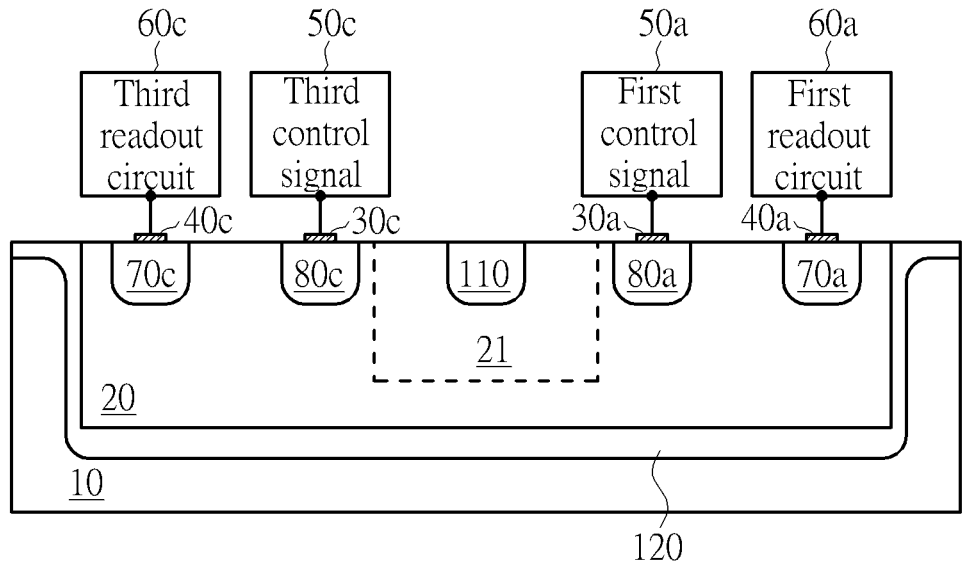
FIG. 4H shows the cross-sectional view along the first axis of symmetry S1 in FIG. 4A according to another embodiment of the present disclosure.
Figure 4I:
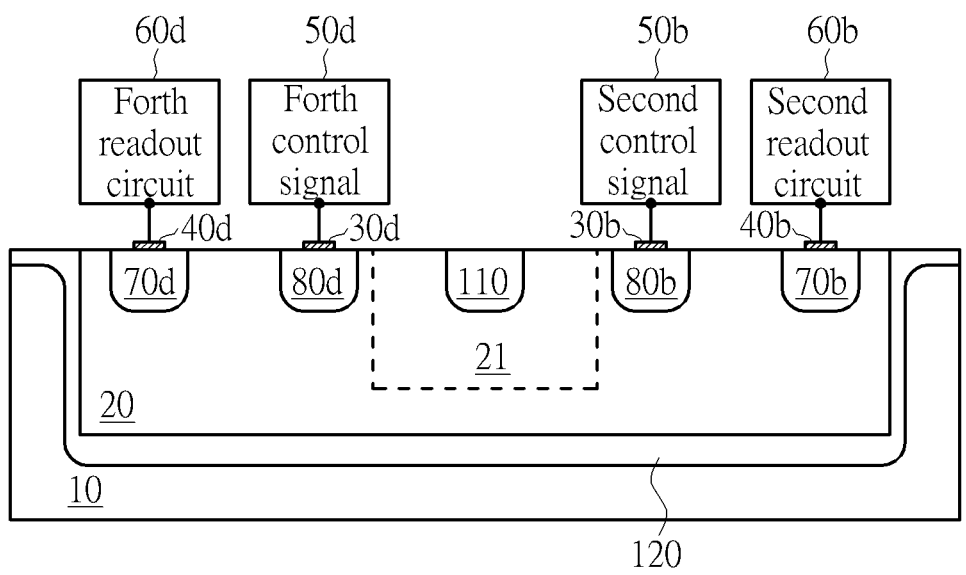
FIG. 4I shows the cross-sectional view along the second axis of symmetry S2 in FIG. 4A according to another embodiment of the present disclosure.

FIG. 4H shows the cross-sectional view along the first axis of symmetry S1 in FIG. 4A according to another embodiment of the present disclosure. FIG. 4I shows the cross-sectional view along the second symmetric axis S2 in FIG. 4A according to another embodiment of the present disclosure. Some features of this embodiment similar/identical to those of the embodiment of 4D and 4E are omitted here for brevity. As shown in FIG. 4H, the photodetector of the pixel of the optoelectronic device further includes a doped region 110 in the light-absorption region 20 and between the carrier control regions 80a-80d. In some embodiments, the doped region 110 is separated from the carrier control regions 80a-80d. In some embodiments, the doped region 110 is overlapped by at least a portion of each of the carrier control regions 80a-80d. The doped region 110 is of a third conductivity type the same as the first conductivity type of the carrier collection regions 70a-70d. In some embodiments, the doped region 110 includes a third dopant and has a dopant profile with a peak between $1 \times 10^{18}$ cm$^{-3}$ and $5 \times 10^{20}$ cm$^{-3}$. In some embodiments, the doped region 110 is operated to collect the electrons and serves as a preliminary collector. The electrons stored in the doped region 110 may be further moved to one of the carrier collection regions 70a-70d based on the control of the first control signal 50a, the second control signal 50b, the third control signal 50c and the fourth control signal 50d. Accordingly, the demodulation contrast of the optoelectronic device is improved. In some embodiments, the optoelectronic device may further include a conductive layer (not shown) electrically connected to the doped region 110. The doped region 110 may be biased through the conductive layer.

Referring to FIGS. 4H and 4I again, the pixel of the optoelectronic device further includes a blocking layer 120 surrounding at least a part of the light-absorption region 20, wherein the blocking layer 120 is of a conductivity type different from the first conductivity type of each of the carrier collection regions 70a-70d. The blocking layer 120 may block photo-generated charges in the light-absorption region 20 from reaching the substrate 10, which increases the collection efficiency of photo-generated carriers of the optoelectronic device. The blocking layer 120 may also block photo-generated charges in the substrate 10 from reaching the light-absorption region 20, which increases the speed of photo-generated carriers of the optoelectronic device. The blocking layer 120 may include a material the same as the material of the light-absorption region 20, the material of the substrate 10, a material as a combination of the material of the light-absorption region 20 and the material of the substrate 10, or different from the material of the light-absorption region 20 and the material of the substrate 10. In some embodiments, the shape of the blocking layer 120 may be, but is not limited to a ring. In some embodiments, the blocking layer 120 includes a dopant having a peak dopant concentration ranging from $10^{15}$ cm$^{-3}$ to $10^{20}$ cm$^{-3}$. The blocking layer 120 may reduce the crosstalk between two adjacent pixels.

In some embodiments, the blocking layer 120 may be extended to reach the top surface of the substrate 10. In some embodiments, the optoelectronic device may further include a conductive layer (not shown) electrically connected to the blocking layer 120. The blocking layer 120 may be biased through the conductive layer by a bias voltage to discharge carriers that are not collected by the carrier collection regions 70a-70d. In some embodiments, since the doped region 110 and blocking layer 120 are collectively formed as a vertical photodiode, there is a built-in vertical electrical field established between the doped region 110 and the blocking layer 120, which may assist in separating the electron-hole pairs generated by the absorbed photons in the light-absorption region 20. For example, when the doped region 110 is of n-type and the blocking layer 120 is of p-type, the electrons tend to move toward the doped region 110 and the holes tends to move toward the blocking layer 120. The doped region 110 is operated to collect the electrons and serves as a preliminary collector. The blocking layer 120 is operated to collect the holes. The electrons stored in the doped region 110 may be further moved to one of the carrier collection regions 70a-70d based on the control of the first control signal 50a, the second control signal 50b, the third control signal 50c and the fourth control signal 50d. Accordingly, the demodulation contrast of the optoelectronic device is improved.

Figure 5A:
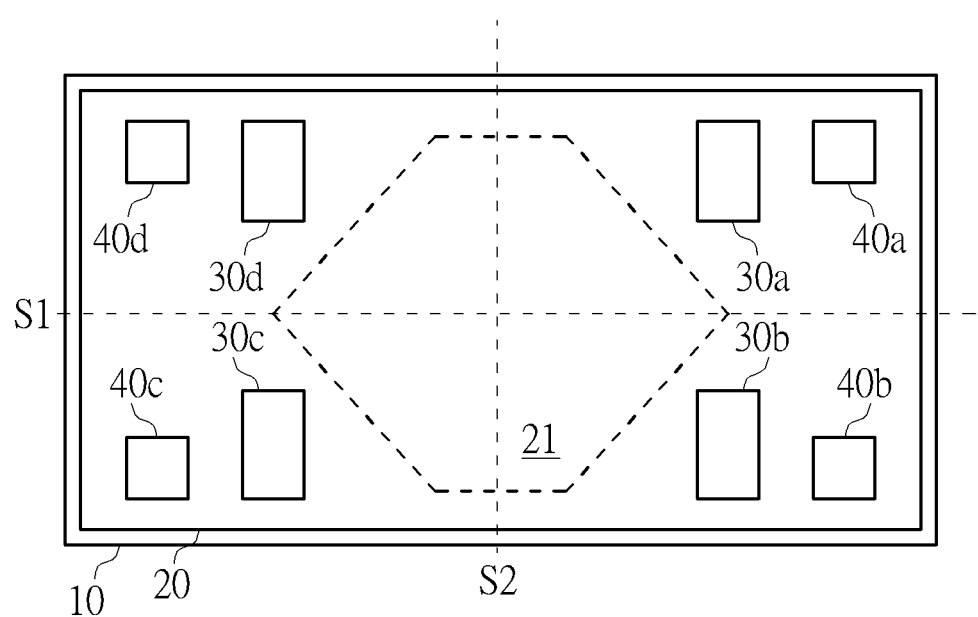
FIG. 5A shows the top view of a pixel of an optoelectronic device according to an embodiment of the present disclosure.

FIG. 5A shows the top view of a pixel of an optoelectronic device according to an embodiment of the present disclosure. As shown in FIG. 5A, a hexagonal light-absorption area 21 is adopted to avoid the negative effects of weak fields and to further enlarge the area for receiving an optical signal.

Figure 5B:
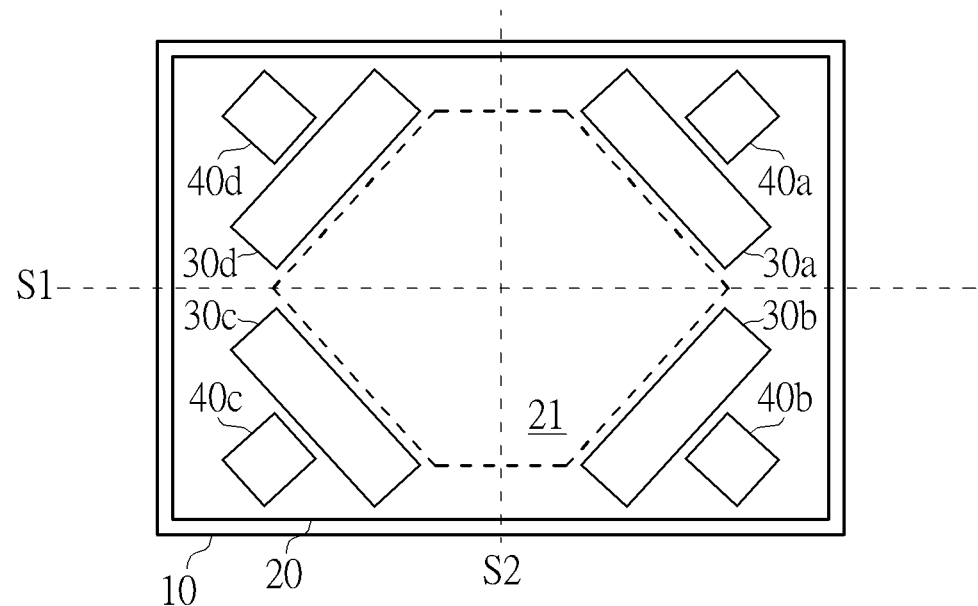
FIG. 5B shows the top view of a pixel of an optoelectronic device according to an embodiment of the present disclosure.

FIG. 5B shows the top view of a pixel of an optoelectronic device according to an embodiment of the present disclosure. The readout contact layers 40a-40d and all control contact layers 30a-30d aligned with the respective long-sides of the light-absorption area 21, wherein the light-absorption area 21 includes four long-sides and two short-sides. The pixel in FIG. 5B provides better floating isolation in vertical direction, thereby avoiding coupling effects among readout contact layers 40a-40d. Besides, the pixel can be further scaled sown in size. Some features in FIGS. 5A-5B similar to those in previous embodiments are omitted here for brevity.

Figure 6A:
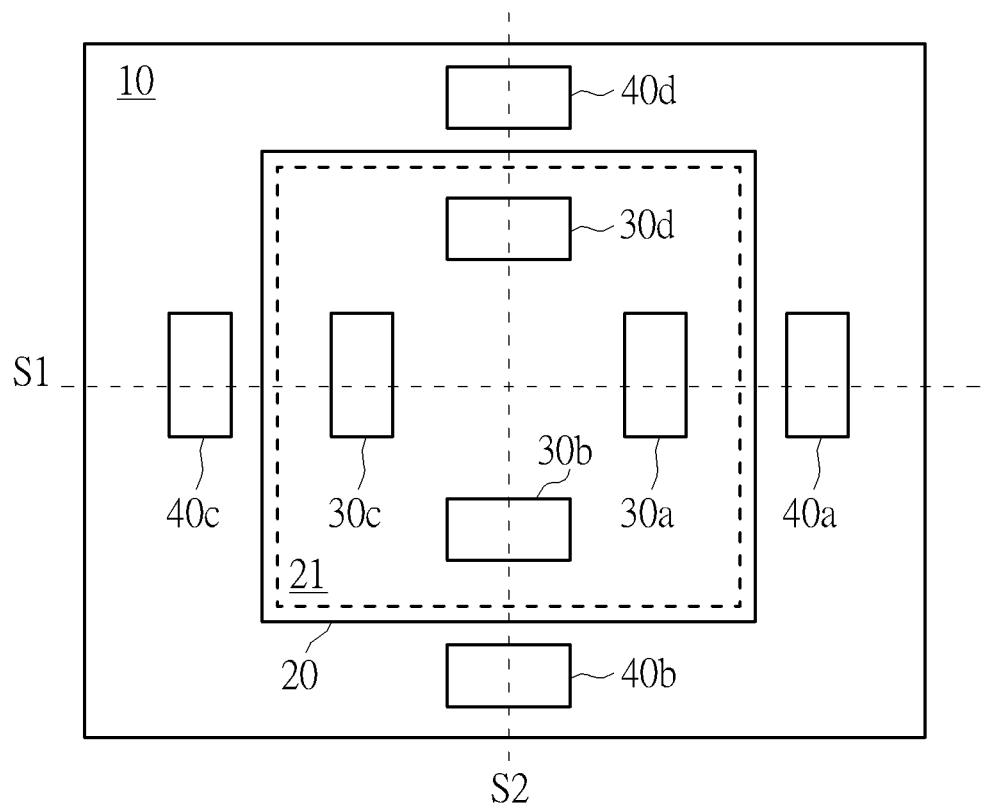
FIG. 6A shows the top view of a pixel of an optoelectronic device according to an embodiment of the present disclosure.
Figure 6B:
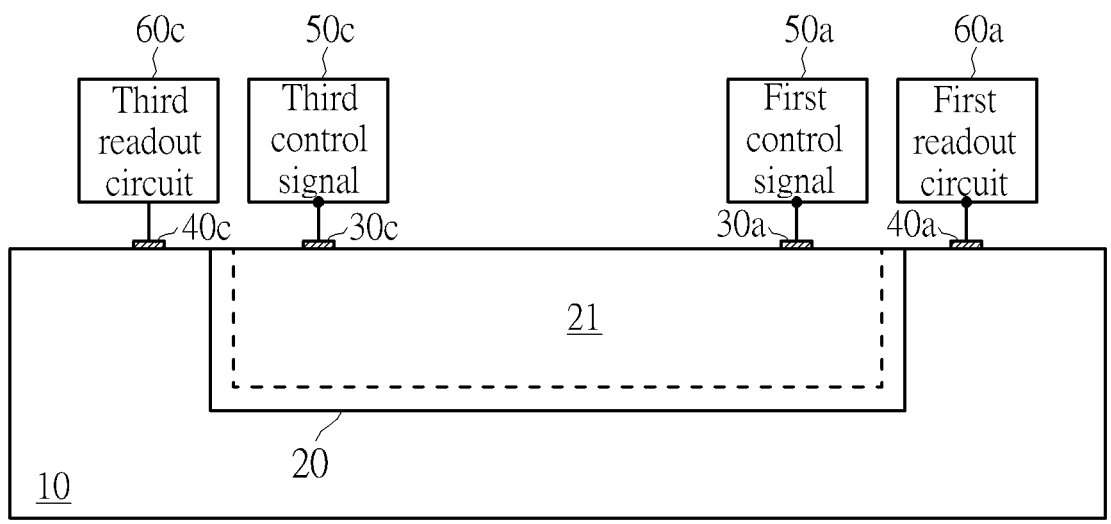
FIG. 6B shows the cross-sectional view along the first axis of symmetry S1 in FIG. 6A.
Figure 6C:
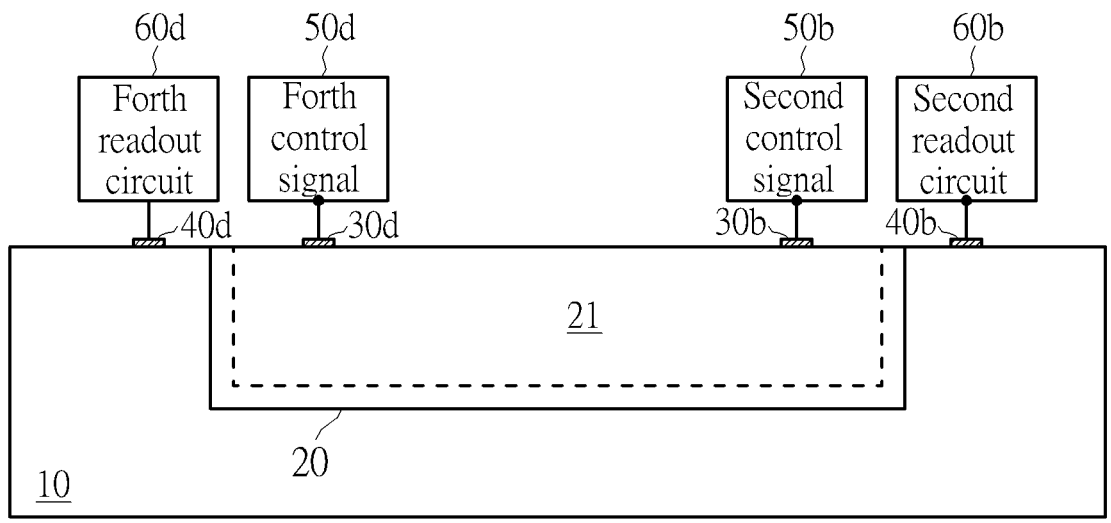
FIG. 6C shows the cross-sectional view along the second axis of symmetry S2 in FIG. 6A.

Please refer to FIG. 6A-FIG. 6C. FIG. 6A shows the top view of a pixel of an optoelectronic device according to an embodiment of the present disclosure. FIG. 6B shows the cross-sectional view along the first axis of symmetry S1 in FIG. 6A. FIG. 6C shows the cross-sectional view along the second symmetric axis S2 in FIG. 6A. The pixel of an optoelectronic device in FIG. 6A-6C is similar to the pixel of an optoelectronic device in FIG. 3A-3C, where the difference is described below. In this embodiment, the control contact layers 30a-30d are formed on the light-absorption region 20, while the readout contact layers 40a-40d are formed on the substrate 10. In some embodiments, the distance between the two readout contact layers on opposite sides of the light-absorption area 21 is greater than the width of the light-absorption region 20. For example, the distance between the two readout contact layers 40a, 40c is greater than the width of the light-absorption region 20. In some embodiments, the distance between the two control contact layers on opposite sides of the light-absorption area 21 is less than the width of the light-absorption region 20. For example, the distance between the two control contact layers 30a, 30c, is less than the width of the light-absorption region 20.

Figure 7A:
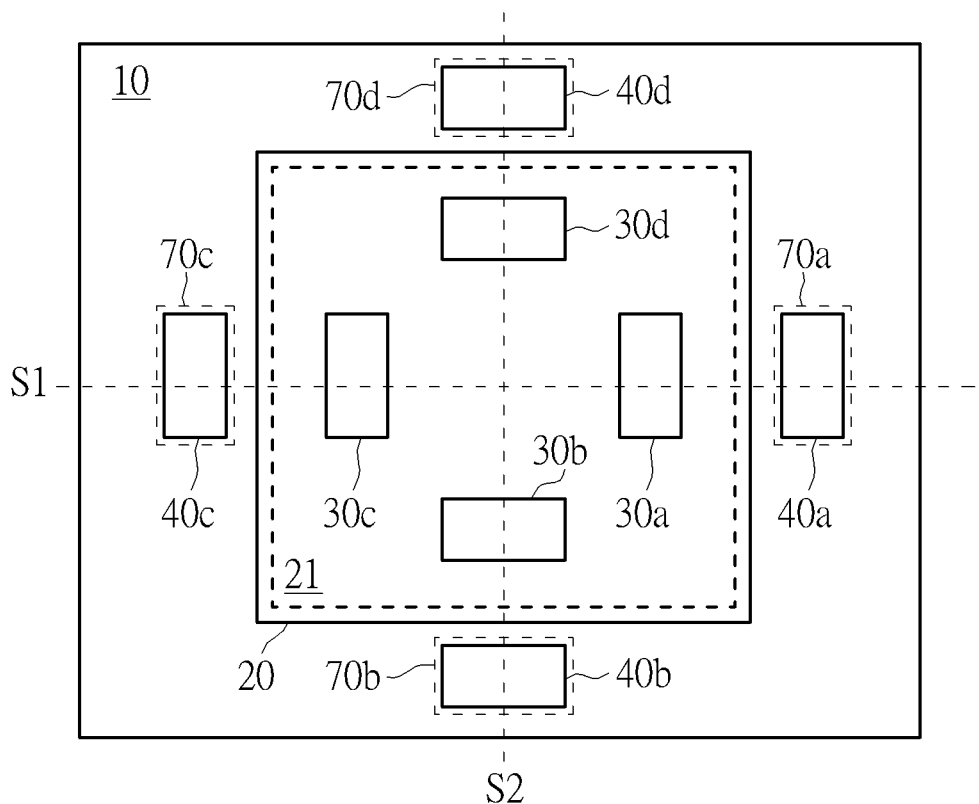
FIG. 7A shows the top view of a pixel of an optoelectronic device according to an embodiment of the present disclosure.
Figure 7B:
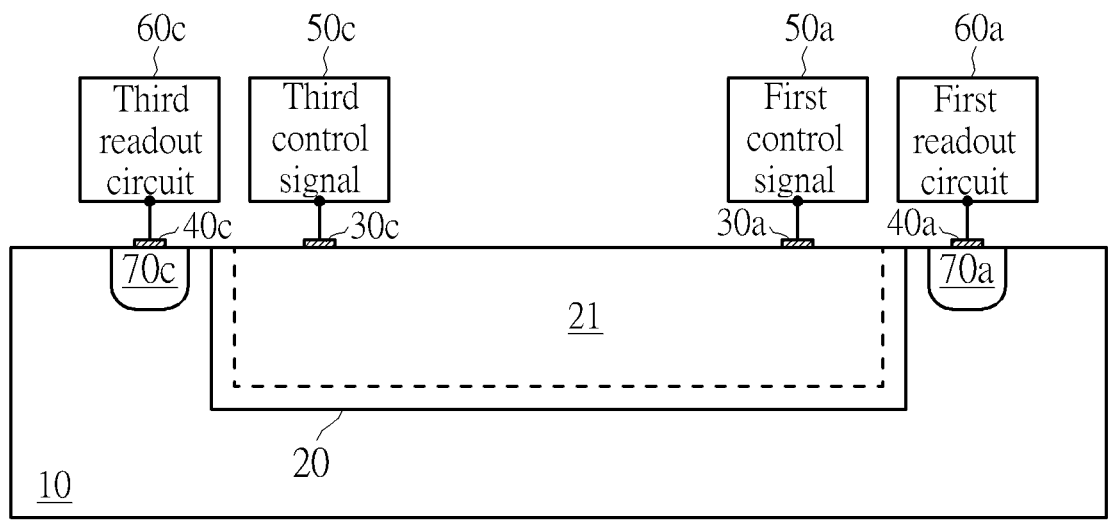
FIG. 7B shows the cross-sectional view along the first axis of symmetry S1 in FIG. 7A.

FIG. 7A shows top view of a pixel of an optoelectronic device according to an embodiment of the present disclosure. FIG. 7B shows the cross-sectional view along the first axis of symmetry S1 in FIG. 7A.

Figure 7C:
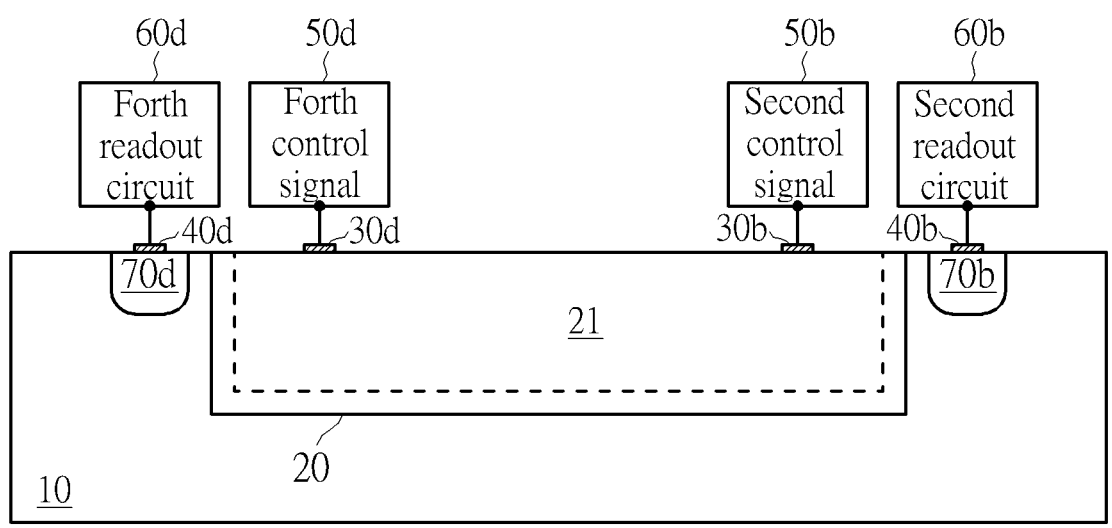
FIG. 7C shows the cross-sectional view along the second axis of symmetry S2 in FIG. 7A.

FIG. 7C shows the cross-sectional view along the second symmetric axis S2 in FIG. 7A. The pixel of the optoelectronic device in FIG. 7A-7C is similar to the pixel of the optoelectronic device in FIG. 6A-6C, where the difference is described below. Each of the switches T1-T4 further includes a carrier collection regions 70a-70d under the readout contact layers 40a-40d. The carrier collection regions 70a-70d are similar to the carrier collection regions 70a-70d as described in FIG. 4A through FIG. 4C.

Figure 8A:
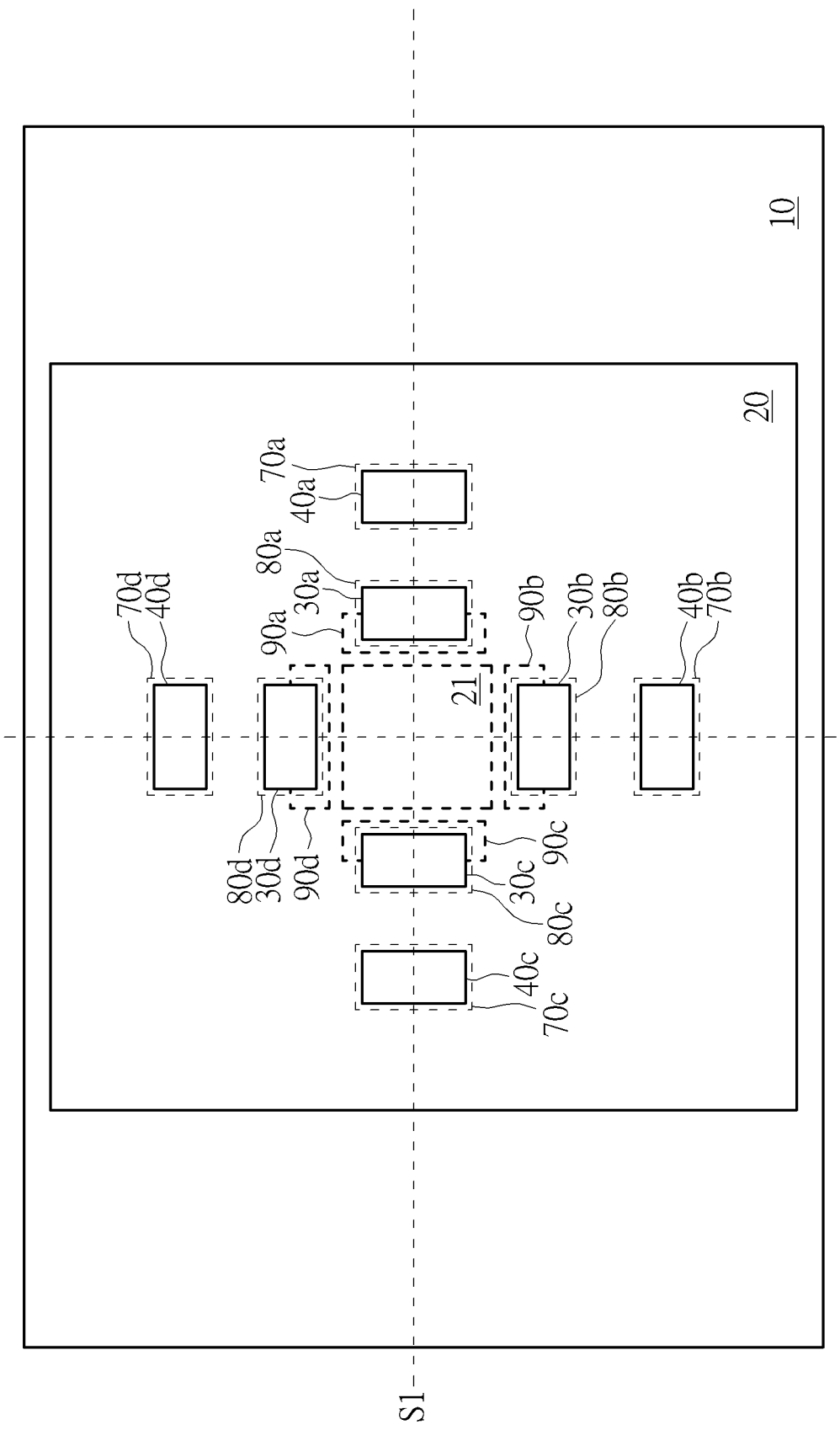
FIG. 8A shows the top view of a pixel of an optoelectronic device according to an embodiment of the present disclosure.
Figure 8B:
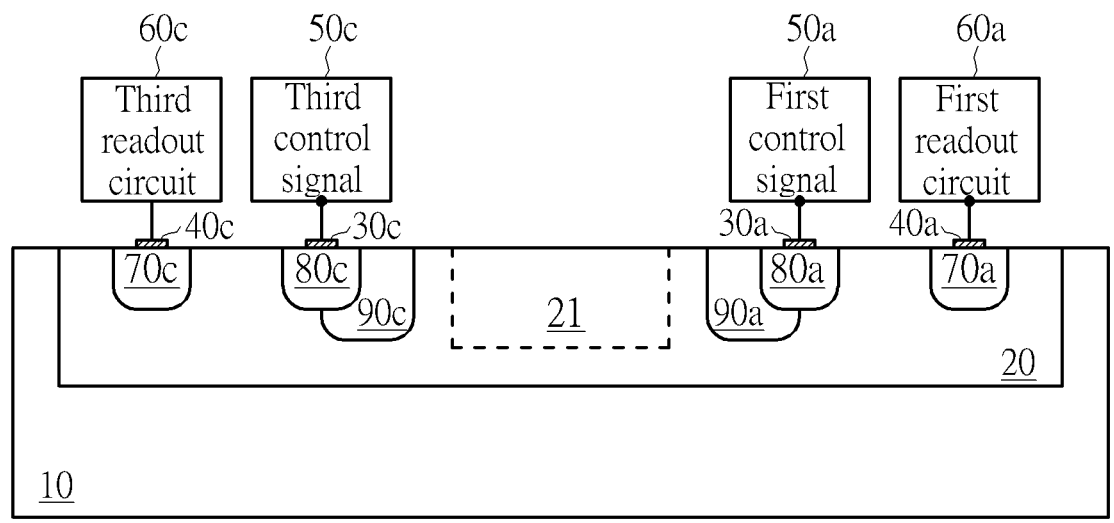
FIG. 8B shows the cross-sectional view along the first axis of symmetry S1 in FIG. 8A.
Figure 8C:
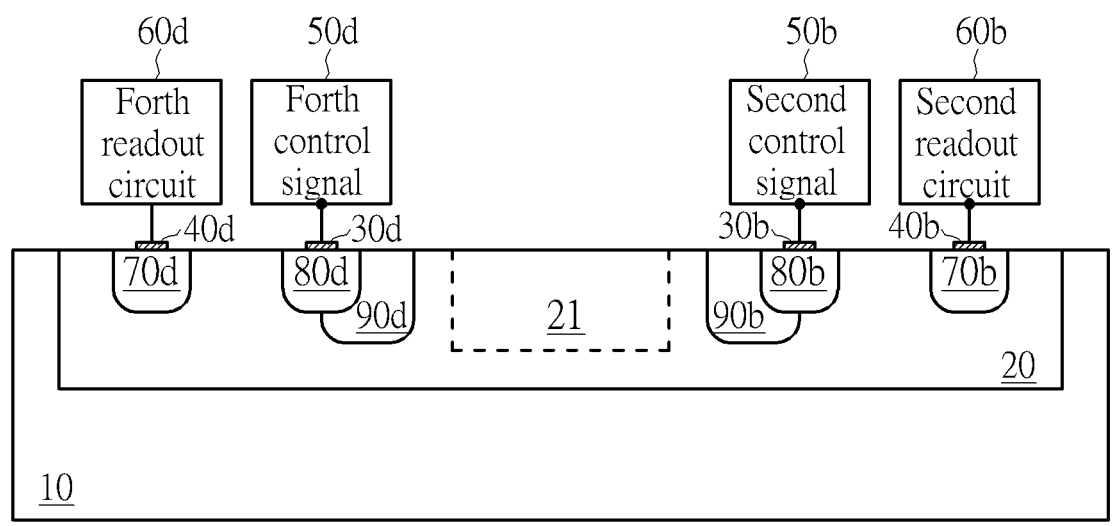
FIG. 8C shows the cross-sectional view along the second axis of symmetry S2 in FIG. 8A.

Please refer to FIGS. 8A-8C. FIG. 8A shows the top view of a pixel of an optoelectronic device according to an embodiment of the present disclosure, FIG. 8B shows the cross-sectional view along the first axis of symmetry S1 of FIG. 8A, and FIG. 8C shows the cross-sectional view along the second symmetric axis S2 of FIG. 8A. The pixel of an optoelectronic device in FIG. 8A-8C is similar to the pixel of an optoelectronic device in FIG. 4D-4E, where the difference is described below.

The photodetector further includes four first counter-doped regions 90a-90d in the light-absorption region 20 and overlap with at least a portion of the carrier control regions 80a-80d respectively. For example, the first counter-doped regions 90a overlaps with at least a portion of the carrier control region 80a. The first counter-doped regions 90b overlaps at least a portion of the carrier control region 80b. The first counter-doped regions 90c overlaps with at least a portion of the carrier control region 80c. The first counter-doped regions 90d overlaps with at least a portion of the carrier control region 80d.

In some embodiments, each of the first counter-doped regions 90a-90d overlaps with a portion of respective carrier control regions 80a-80d that are far from the readout contact layers 40a-40d, and the other portions of the carrier control regions 80a-80d are not overlapped by the first counter-doped regions 90a-90d.

In some embodiments, each of the carrier control regions 80a-80d entirely overlaps with the first counter-doped regions 90a-90d, respectively.

Each of the first counter-doped regions 90a-90d has a conductivity type different from the second conductivity type of the carrier control regions 80a-80d. In some embodiments, the optoelectronic device is configured to process the collected electrons for further application. In such an embodiment, the carrier collection regions 70a-70d are of n-type, the carrier control regions 80a-80d are of p-type, and the first counter-doped regions 90a-90d are of n-type.

In some embodiments, the first counter-doped regions 90a-90d may serve as dark-current reduction regions for reducing the dark current of the optoelectronic device. In some embodiments, each of the first counter-doped regions 90a-90d includes a dopant and a doping profile with a peak dopant concentration. The peak dopant concentration is not less than $1\times10^{15}$ cm$^{-3}$. In one embodiment, the peak dopant concentrations of the first counter-doped regions 90a-90d are lower than the peak dopant concentrations of the carrier control regions 80a-80d. In some embodiments, the peak dopant concentration of each of the first counter-doped regions 90a-90d is not more than $5\times10^{17}$ cm$^{-3}$, such as between $1\times10^{15}$ cm$^{-3}$ and $1\times10^{17}$ cm$^{-3}$. The first counter-doped regions 90a-90d can also reduce the leakage current between the carrier control regions 80a-80d.

Figure 9A:
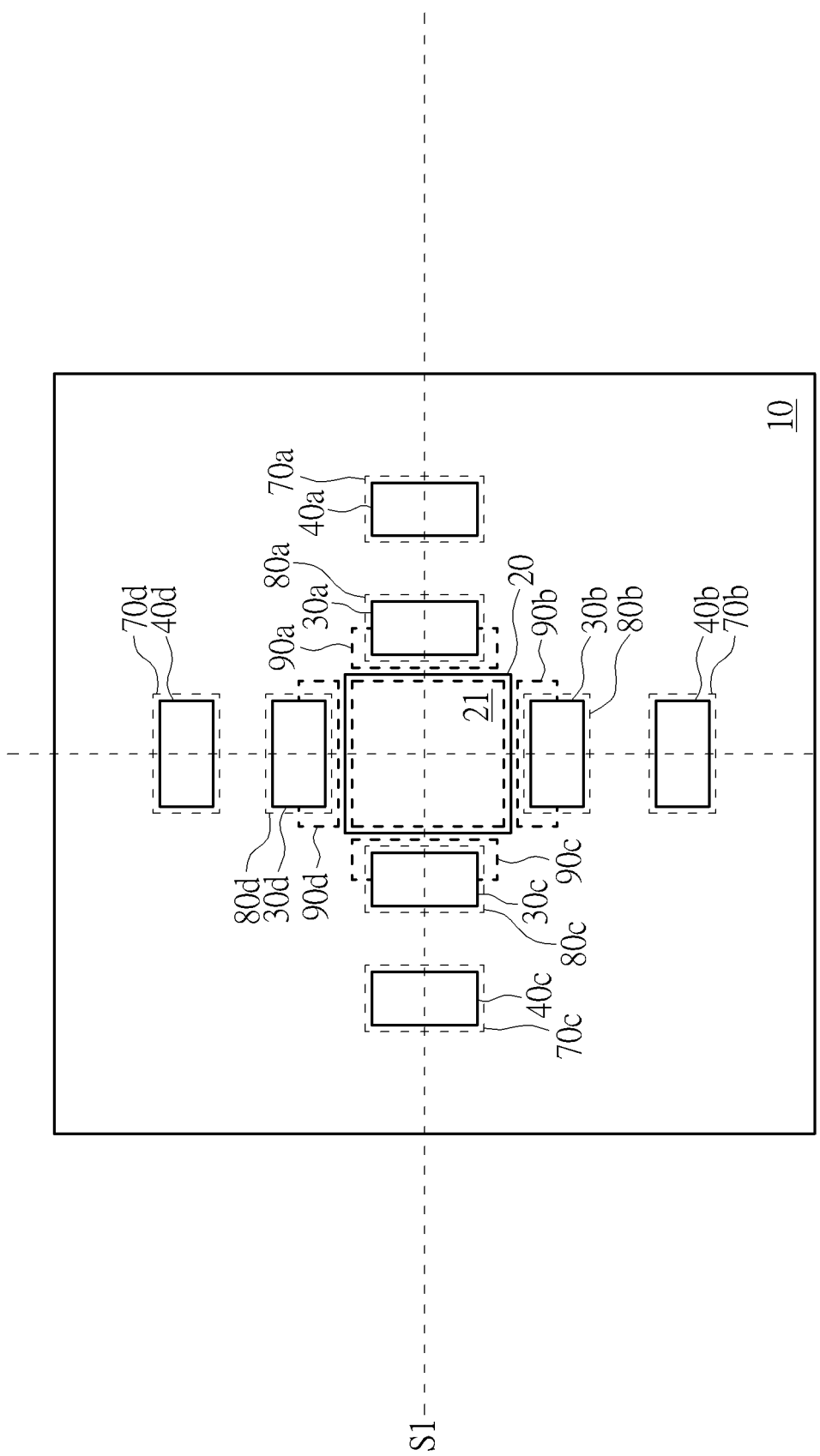
FIG. 9A shows the top view of a pixel of an optoelectronic device according to an embodiment of the present disclosure.
Figure 9B:
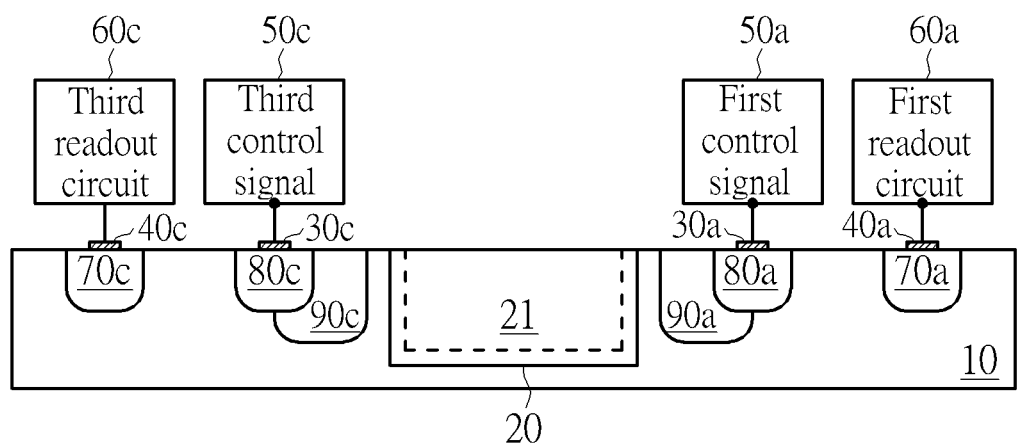
FIG. 9B shows the cross-sectional view along the first axis of symmetry S1 in FIG. 9A.
Figure 9C:
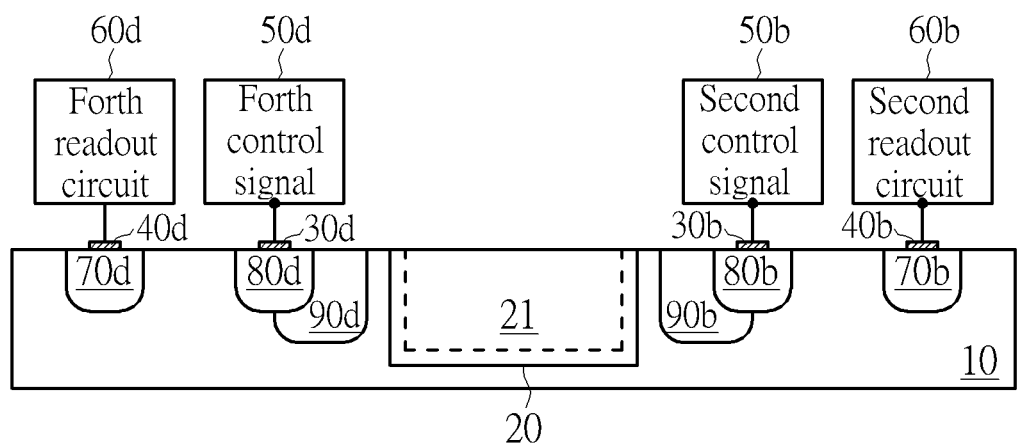
FIG. 9C shows the cross-sectional view along the second axis of symmetry S2 in FIG. 9A.

Please refer to FIGS. 9A-9C. FIG. 9A shows the top view of a pixel of an optoelectronic device according to an embodiment of the present disclosure, FIG. 9B shows the cross-sectional view along the first axis of symmetry S1 of FIG. 9A, and FIG. 9C shows the cross-sectional view along the second symmetric axis S2 of FIG. 9A. The pixel of an optoelectronic device in FIG. 9A-9C is similar to the pixel of an optoelectronic device in FIG. 3D, where the difference is described below. The switches T1-T4 further respectively include the carrier collection regions 70a-70d that located under the readout contact layers 40a-40d. The carrier collection regions 70a-70d are similar to the carrier collection regions 70a-70d as described in FIG. 4A through FIG. 4C. Each of the switches T1-T4 further includes a carrier control regions 80a-80d under the control contact layers 30a-30d. The control regions 80a-80d are similar to the control regions 80a-80d as described in FIG. 4D and FIG. 4E. The photodetector further includes four first counter-doped regions 90a-90d in the substrate 10 and overlap at least a portion of the respective carrier control regions 80a-80d. The first counter-doped regions 90a-90d are similar to the first counter-doped regions 90a-90d as described in FIG. 8A through FIG. 8C.

Figure 10A:
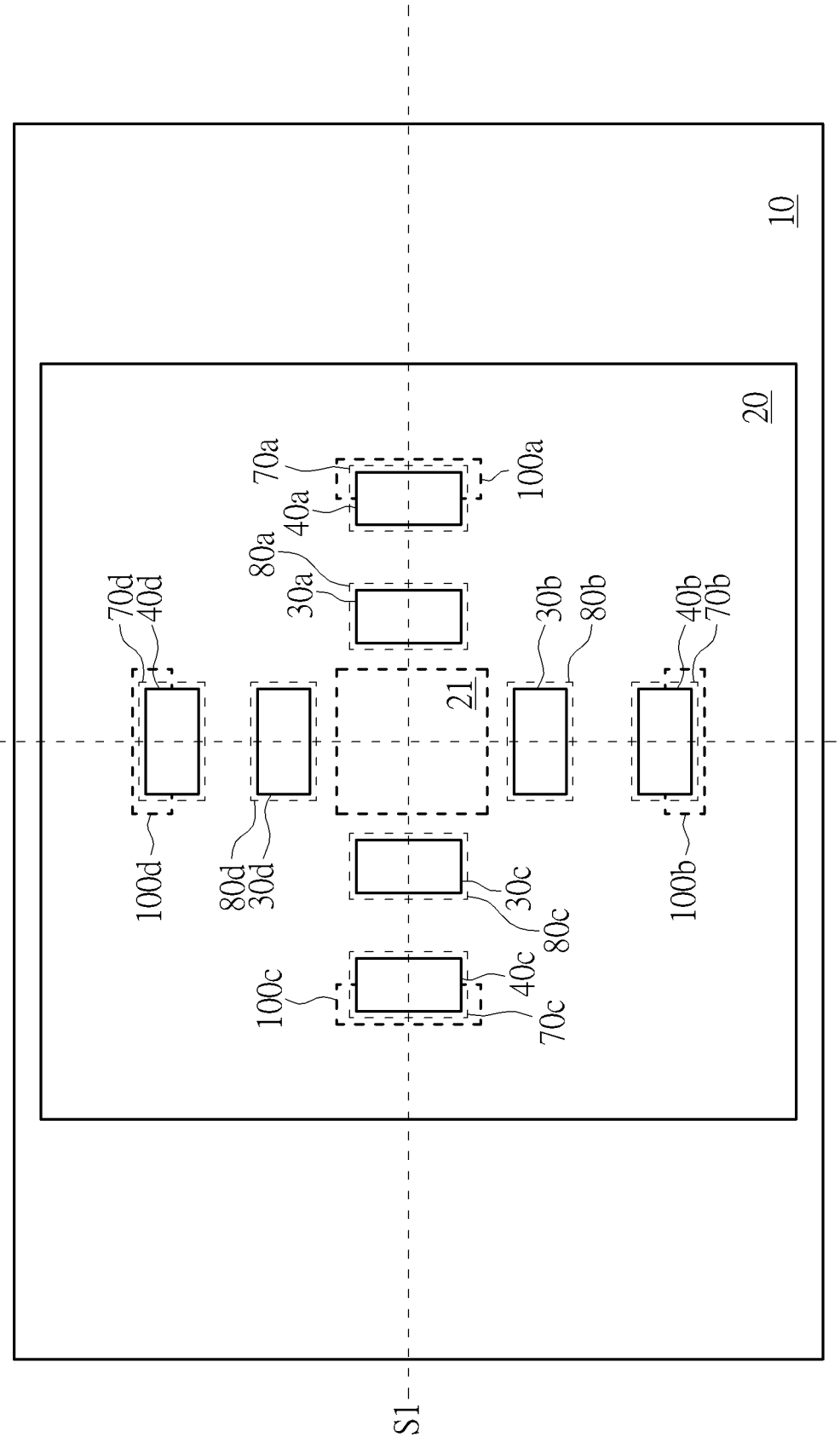
FIG. 10A shows the top view of a pixel of an optoelectronic device according to an embodiment of the present disclosure.
Figure 10B:
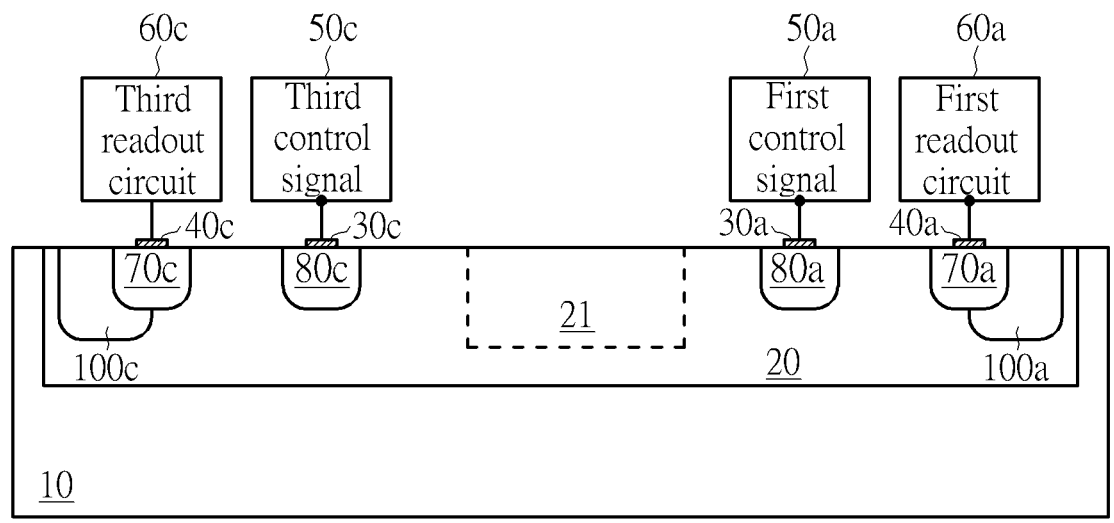
FIG. 10B shows the cross-sectional view along the first axis of symmetry S1 in FIG. 10A.
Figure 10C:
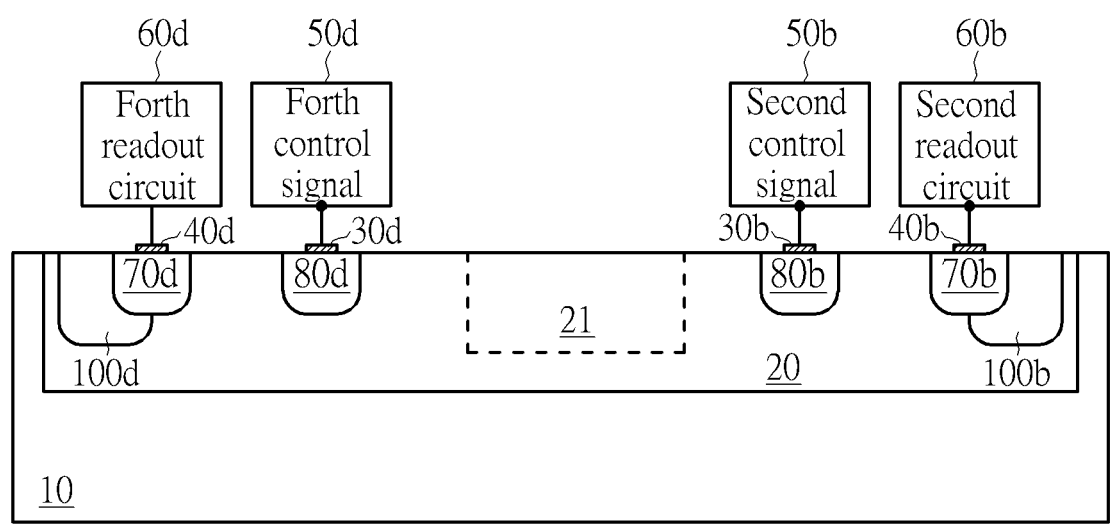
FIG. 10C shows the cross-sectional view along the second axis of symmetry S2 in FIG. 10A.

Please refer to FIGS. 10A-10C. FIG. 10A shows the top view of a pixel of an optoelectronic device according to an embodiment of the present disclosure, FIG. 10B shows the cross-sectional view along the first axis of symmetry S1 of FIG. 10A, and FIG. 10C shows the cross-sectional view along the second symmetric axis S2 of FIG. 10A. The pixel of an optoelectronic device in FIG. 10A-10C is similar to the pixel of an optoelectronic device in FIG. 4D-4E, where the difference is described below.

The photodetector further includes four second counter-doped regions 100a-100d in the light-absorption region 20 and overlap with at least a portion of the respective carrier collection regions 70a-70d. For example, the second counter-doped region 100a overlaps with at least a portion of the carrier control region 80a. The second counter-doped region 100b overlaps with at least a portion of the carrier control region 80b. The second counter-doped region 100c overlaps with at least a portion of the carrier control region 80c. The second counter-doped region 100d overlaps with at least a portion of the carrier control region 80d.

In some embodiments, the second counter-doped regions 100a-100d overlap with a portion of the respective carrier collection regions 70a-70d that are far from the control contact layers 30a-30d, and the other portions of the carrier collection regions 70a-70d are not overlapped by the second counter-doped regions 100a-100d. In some embodiments, each of the carrier collection regions 70a-70d is entirely overlapped by the respective second counter-doped regions 100a-100d.

Each of the second counter-doped regions 100a-100d has a conductivity type different from the first conductivity type of the carrier collection regions 70a-70d. In some embodiments, the optoelectronic device is configured to process the collected electrons for further application. In such an embodiment, the carrier collection regions 70a-70d are of n-type, the carrier control regions 80a-80d are of p-type, and the second counter-doped regions 100a-100d are of p-type.

In some embodiments, the second counter-doped regions 100a-100d serve as dark-current reduction regions for reducing the dark current of the optoelectronic device. In some embodiments, each of the second counter-doped regions 100a-100d includes a dopant and a doping profile with a peak dopant concentration. The peak dopant concentration is not less than $1\times10^{16}$ cm$^{-3}$. In one embodiment, the peak dopant concentrations of the dopants of the second counter-doped regions 100a-100d are lower than the peak dopant concentrations of the carrier collection regions 70a-70d. In some embodiments, the peak dopant concentration of the dopant of each of the second counter-doped regions 100a-100d is between $1\times10^{16}$ cm$^{-3}$ and $1\times10^{19}$ cm$^{-3}$.

Figure 11B:
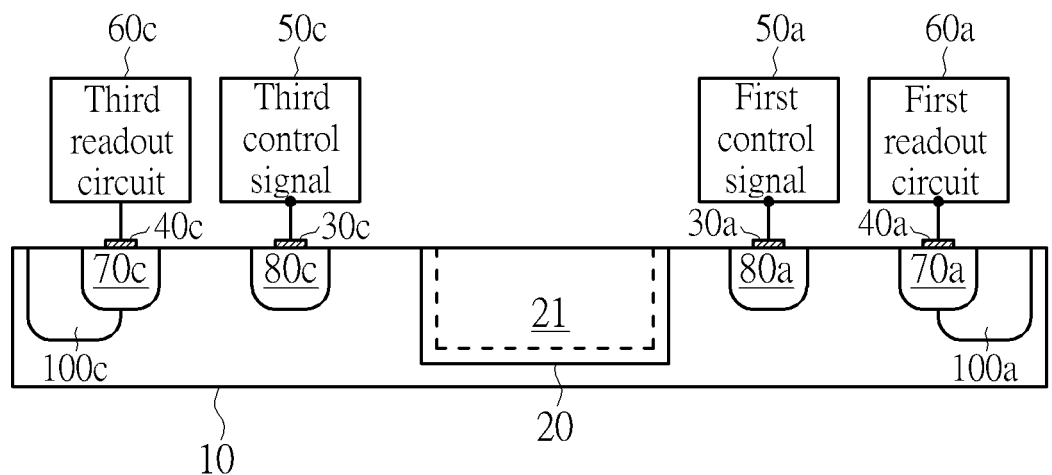
FIG. 11B shows the cross-sectional view along the first axis of symmetry S1 in FIG. 11A.
Figure 11C:
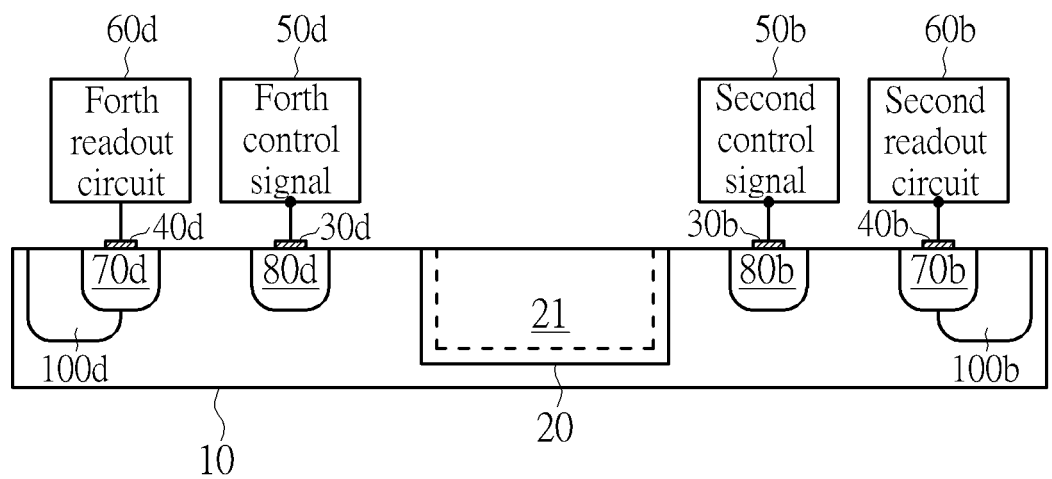
FIG. 11C shows the cross-sectional view along the second axis of symmetry S2 in FIG. 11A.

Please refer to FIGS. 11A-11C. FIG. 11A shows the top view of a pixel of an optoelectronic device according to an embodiment of the present disclosure, FIG. 11B shows the cross-sectional view along the first axis of symmetry S1 of FIG. 11A, and FIG. 11C shows the cross-sectional view along the second symmetric axis S2 of FIG. 11A. The pixel of an optoelectronic device in FIG. 11A-11C is similar to the pixel of an optoelectronic device in FIG. 3D, where the difference is described below. Each of the switches T1-T4 further includes a carrier collection regions 70a-70d located under the readout contact layers 40a-40d. The carrier collection regions 70a-70d are similar to the carrier collection regions 70a-70d as described in FIG. 4A through FIG. 4C. The switches T1-T4 further respectively include the carrier control regions 80a-80d under the control contact layers 30a-30d. The control regions 80a-80d are similar to the control regions 80a-80d as described in FIG. 4D and FIG. 4E. The pixel further includes four second counter-doped regions 100a-100d in the substrate 10 and overlap with at least a portion of the carrier collection regions 70a-70d respectively. The second counter-doped regions 100a-100d are similar to the second counter-doped regions 100a-100d as described in FIG. 10A through FIG. 10C.

Figure 12A:
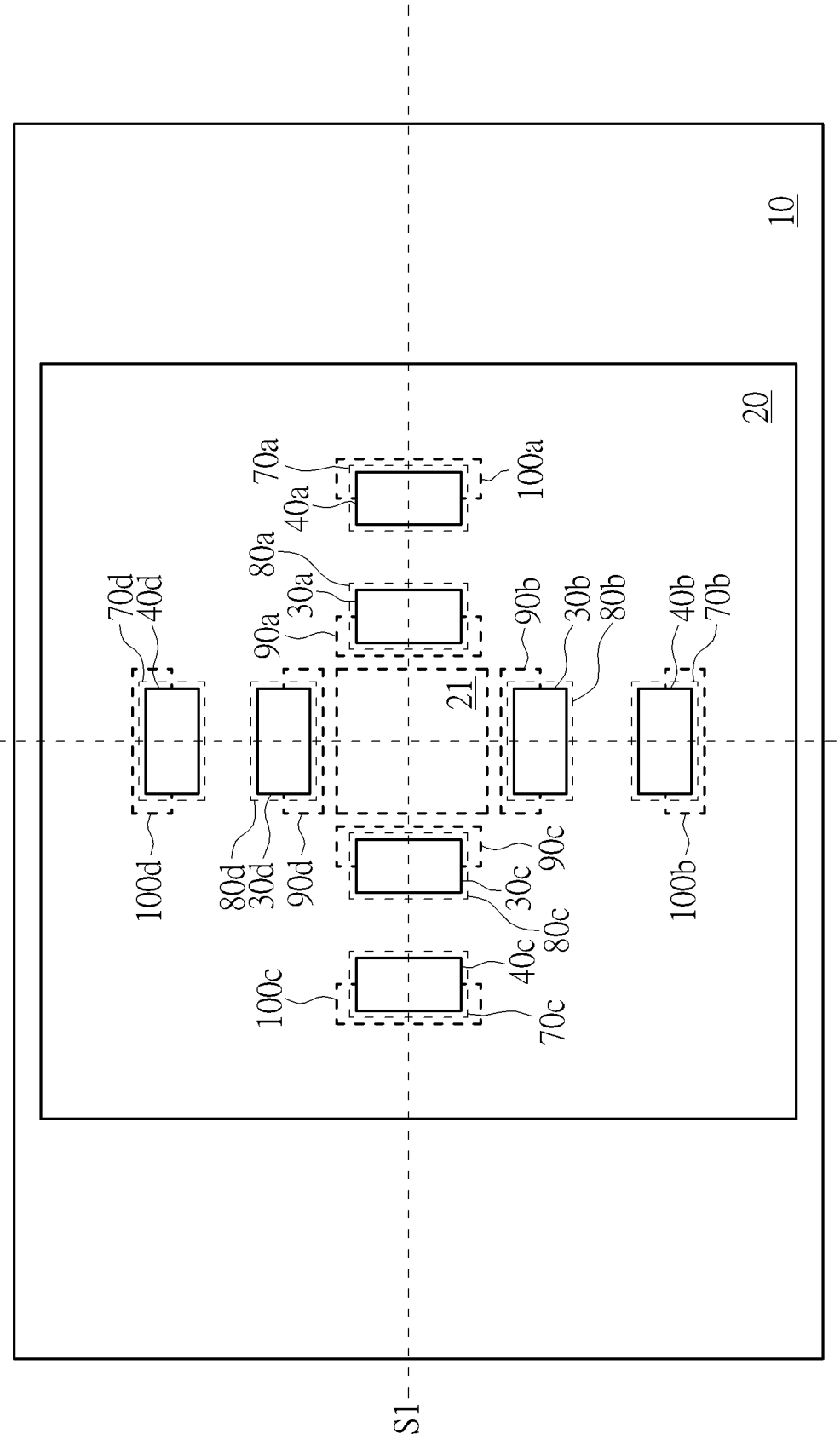
FIG. 12A shows the top view of a pixel of an optoelectronic device according to an embodiment of the present disclosure.
Figure 12B:
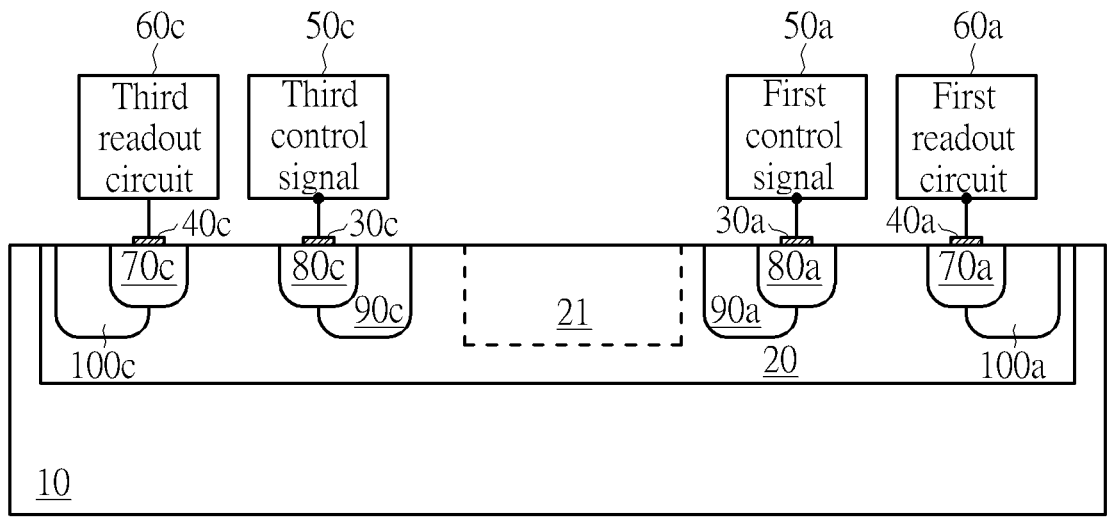
FIG. 12B shows the cross-sectional view along the first axis of symmetry S1 in FIG. 12A.
Figure 12C:
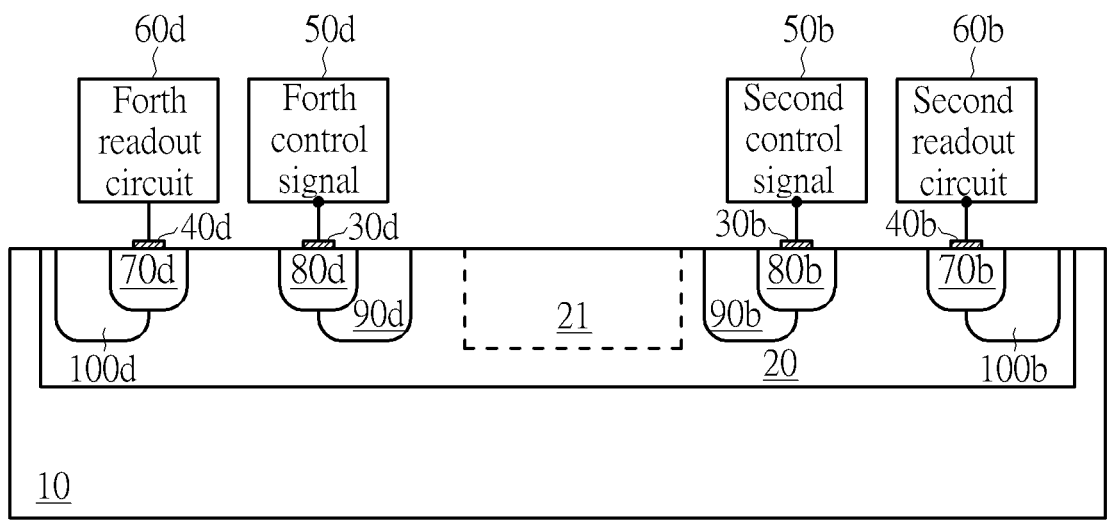
FIG. 12C shows the cross-sectional view along the second axis of symmetry S2 in FIG. 12A.

Please refer to FIGS. 12A-12C. FIG. 12A shows the top view of a pixel of an optoelectronic device according to an embodiment of the present disclosure. FIG. 12B shows the cross-sectional view along the first axis of symmetry S1 of FIG. 12A, and FIG. 12C shows the cross-sectional view along the second symmetric axis S2 of FIG. 12A. The pixel of an optoelectronic device in FIG. 12A-12C is similar to the pixel of an optoelectronic device in FIG. 8A-8C, where the difference is described below. The photodetector further includes four second counter-doped regions 100a-100d in the light-absorption region 20 and overlap with at least a portion of the carrier collection regions 70a-70d respectively. The second counter-doped regions 100a-100d are similar to the second counter-doped regions 100a-100d as described in FIG. 10A through FIG. 10C.

Figure 13A:
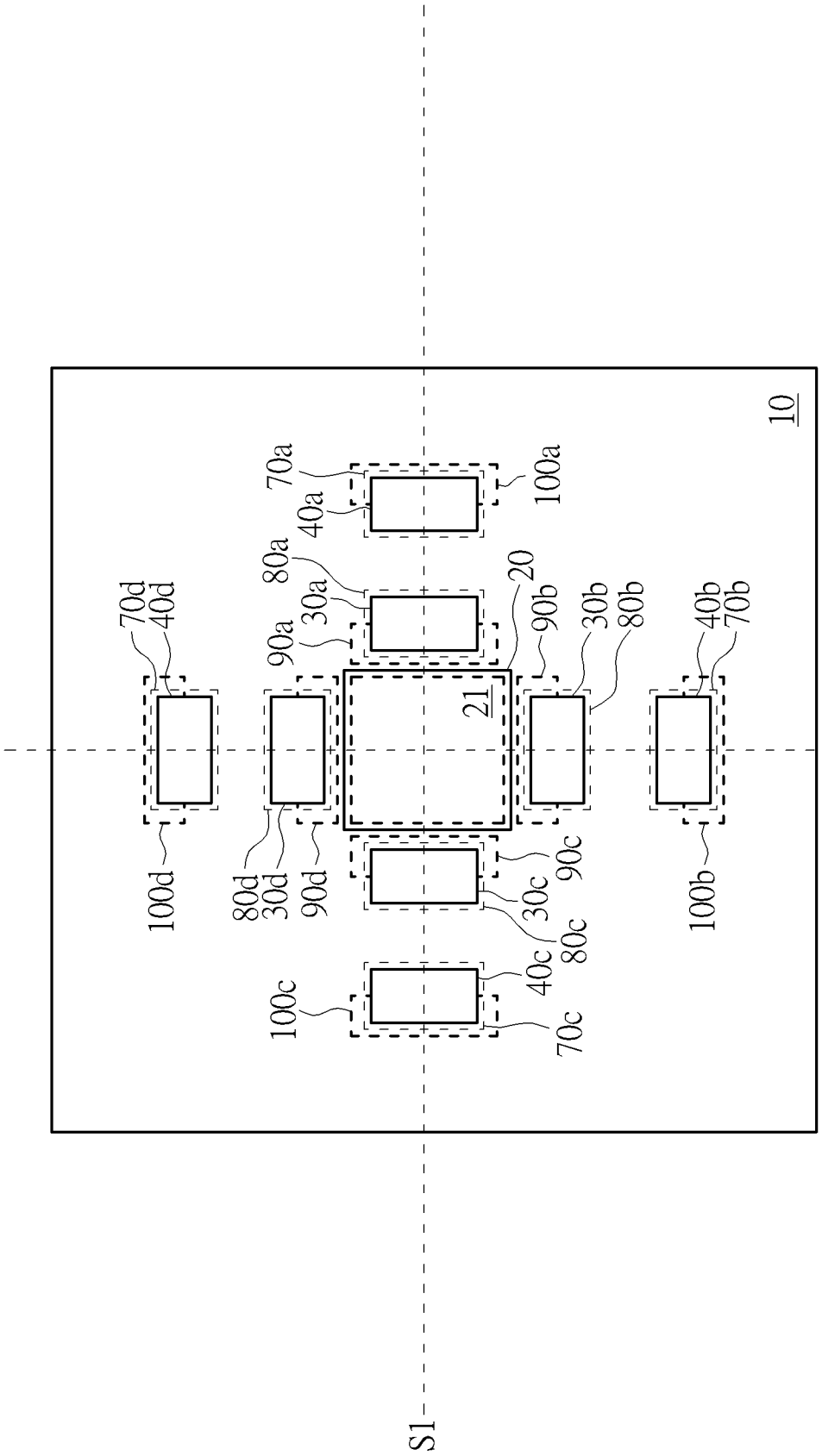
FIG. 13A shows the top view of a pixel of an optoelectronic device according to an embodiment of the present disclosure.
Figure 13B:
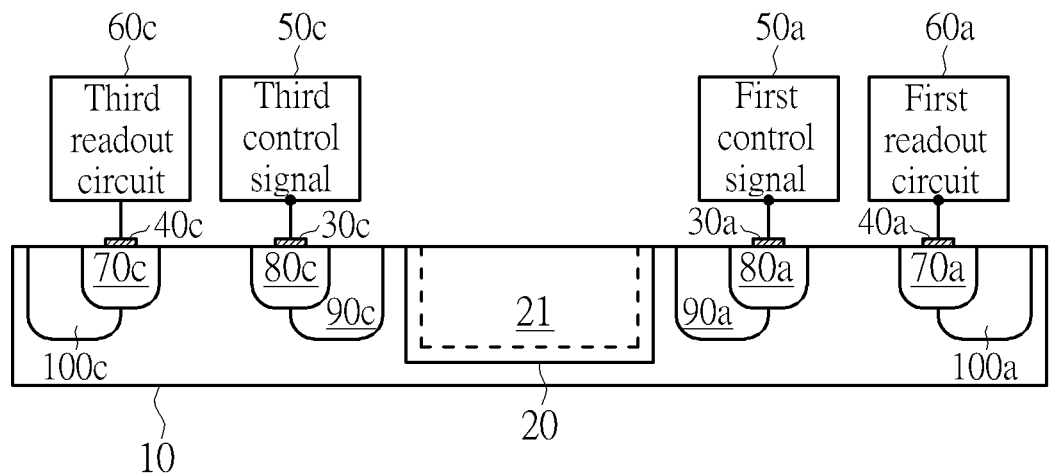
FIG. 13B shows the cross-sectional view along the first axis of symmetry S1 in FIG. 13A.
Figure 13C:
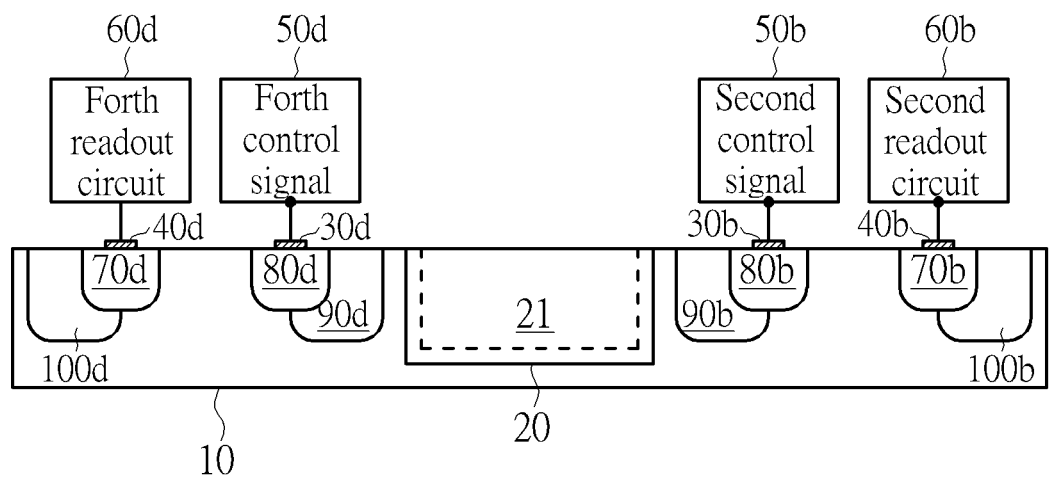
FIG. 13C shows the cross-sectional view along the second axis of symmetry S2 in FIG. 13A.

Please refer to FIGS. 13A-13C. FIG. 13A shows the top view of a pixel of an optoelectronic device according to an embodiment of the present disclosure. FIG. 13B shows the cross-sectional view along the first axis of symmetry S1 of FIG. 13A, and FIG. 13C shows the cross-sectional view along the second symmetric axis S2 of FIG. 13A. The pixel of an optoelectronic device in FIG. 13A-13C is similar to the pixel of an optoelectronic device in FIG. 9A-9C, where the difference is described below. The photodetector further includes four second counter-doped regions 100a-100d in the substrate 10 and overlap with at least a portion of the carrier collection regions 70a-70d respectively. The second counter-doped regions 100a-100d are similar to the second counter-doped regions 100a-100d as described in FIG. 10A through FIG. 10C.

Figure 14A:
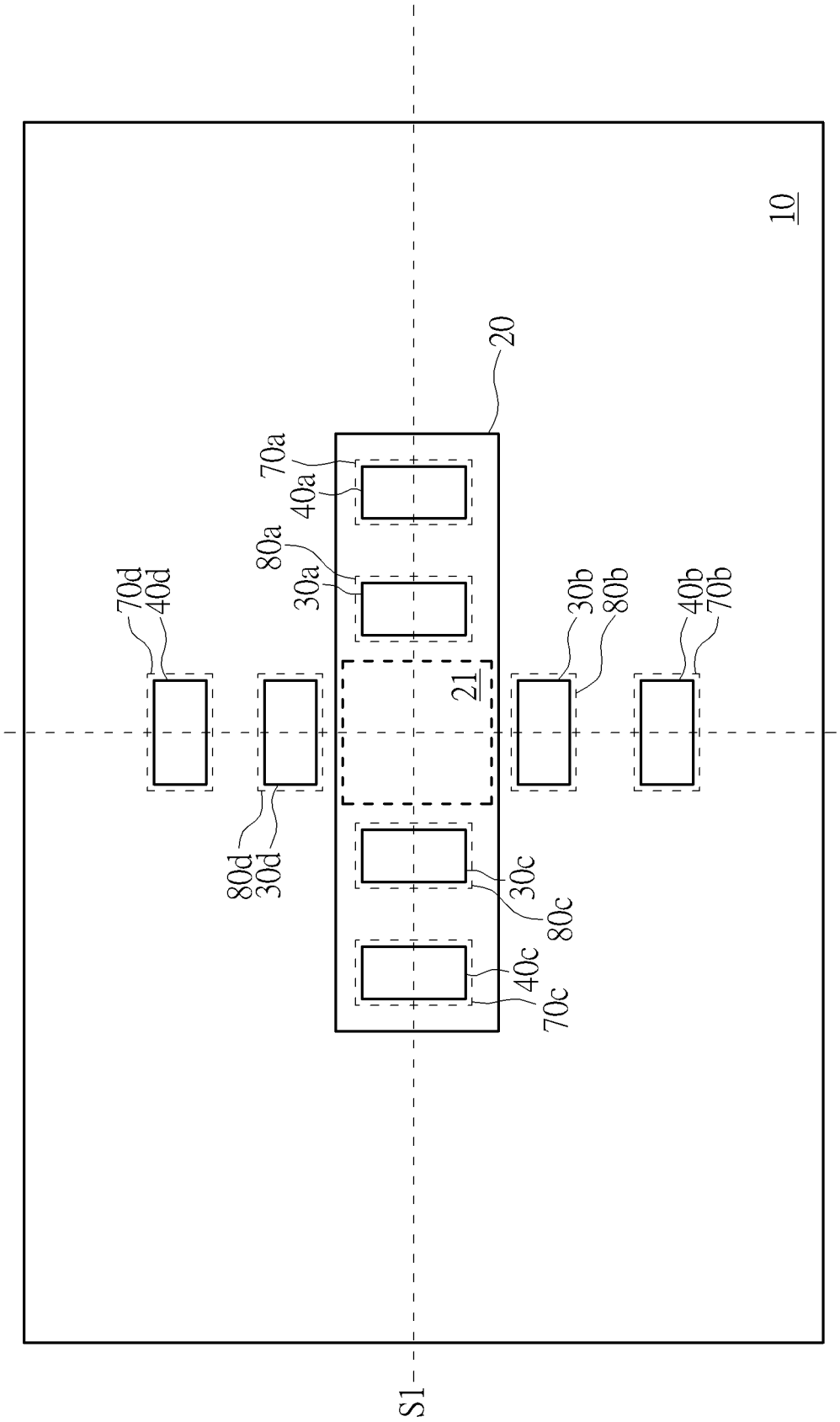
FIG. 14A shows the top view of a pixel of an optoelectronic device according to an embodiment of the present disclosure.
Figure 14B:
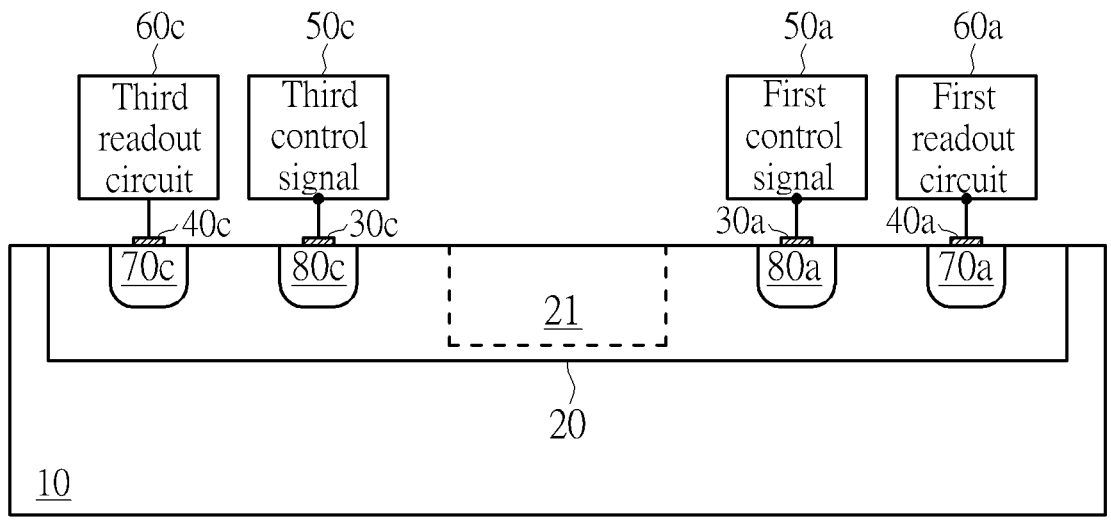
FIG. 14B shows the cross-sectional view along the first axis of symmetry S1 in FIG. 14A.
Figure 14C:
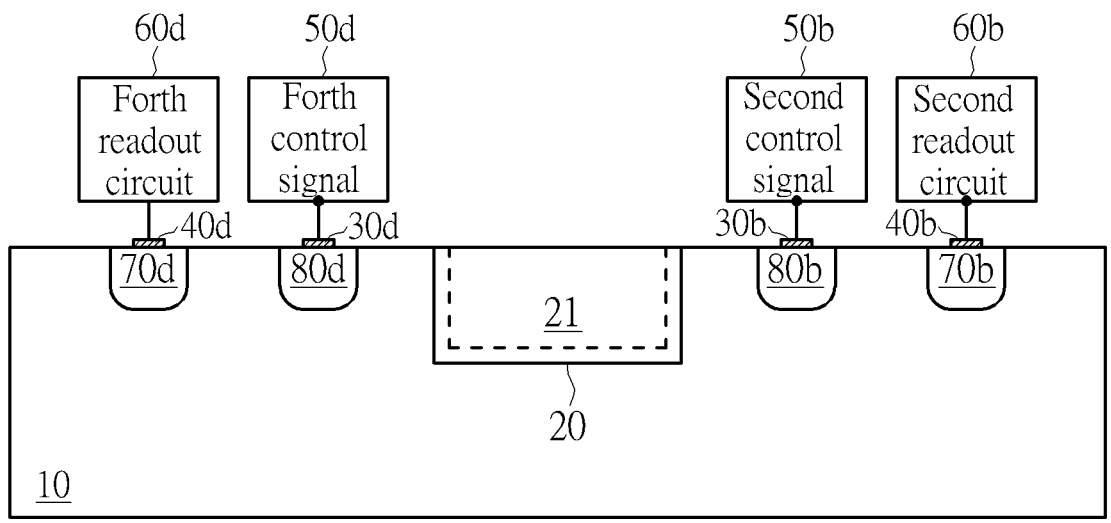
FIG. 14C shows the cross-sectional view along the second axis of symmetry S2 in FIG. 14A.

Please refer to FIGS. 14A-14C. FIG. 14A shows the top view of a pixel of an optoelectronic device according to an embodiment of the present disclosure, FIG. 14B shows the cross-sectional view along the first axis of symmetry S1 of FIG. 14A, and FIG. 14C shows the cross-sectional view along the second symmetric axis S2 of FIG. 14A. The pixel of an optoelectronic device in FIG. 14A-14C is similar to the pixel of an optoelectronic device in FIG. 4D-4E, where the difference is described below. In this embodiment, the control contact layers 30b and 30d and the readout contact layers 40b and 40d are formed on the substrate 10, while the control contact layers 30a and 30c and the readout contact layers 40a and 40c are formed on the light-absorption region 20. The carrier collection regions 70b, 70d and the carrier control regions 80b, 80d are in the substrate 10.

Figure 15A:
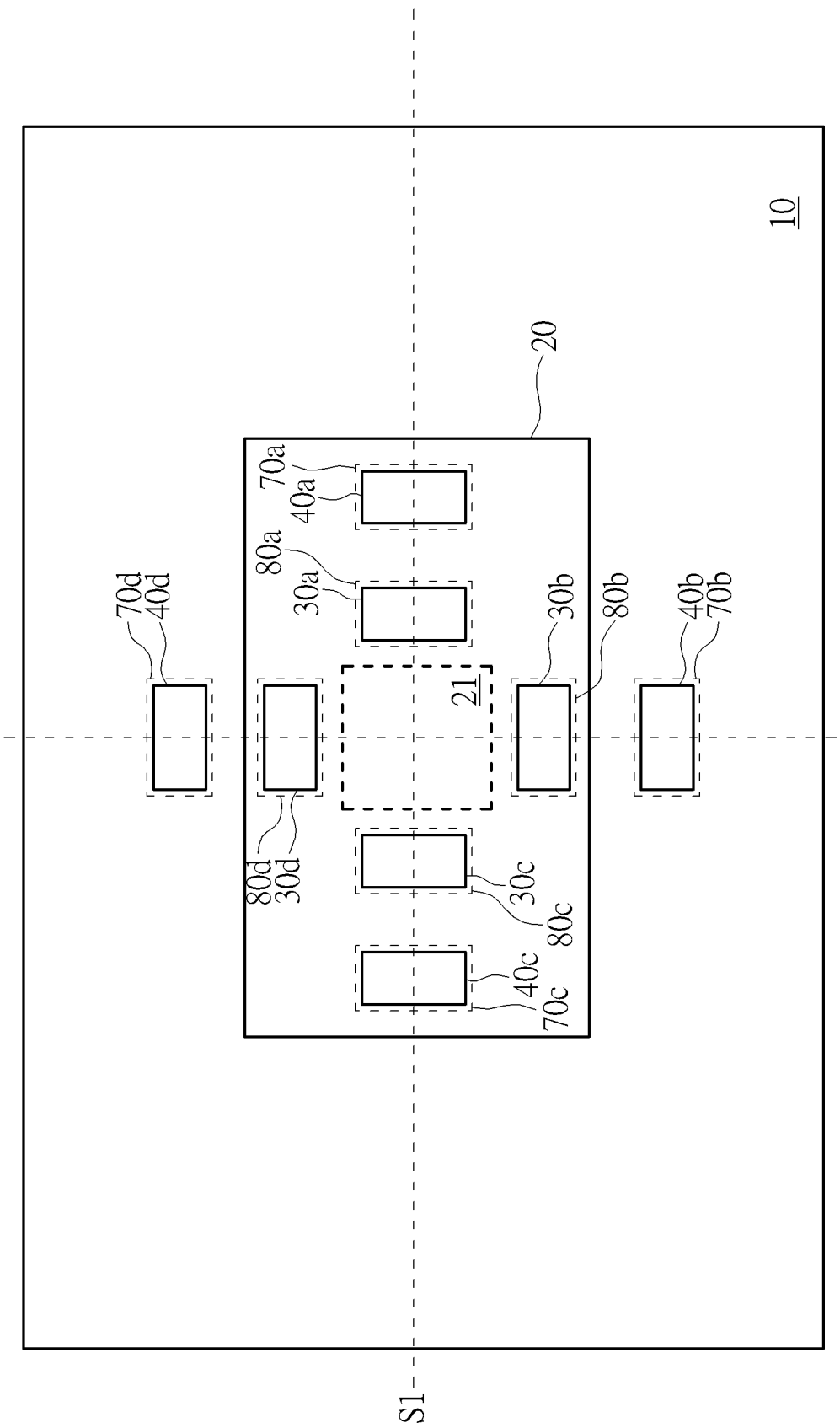
FIG. 15A shows the top view of a pixel of an optoelectronic device according to an embodiment of the present disclosure.
Figure 15B:
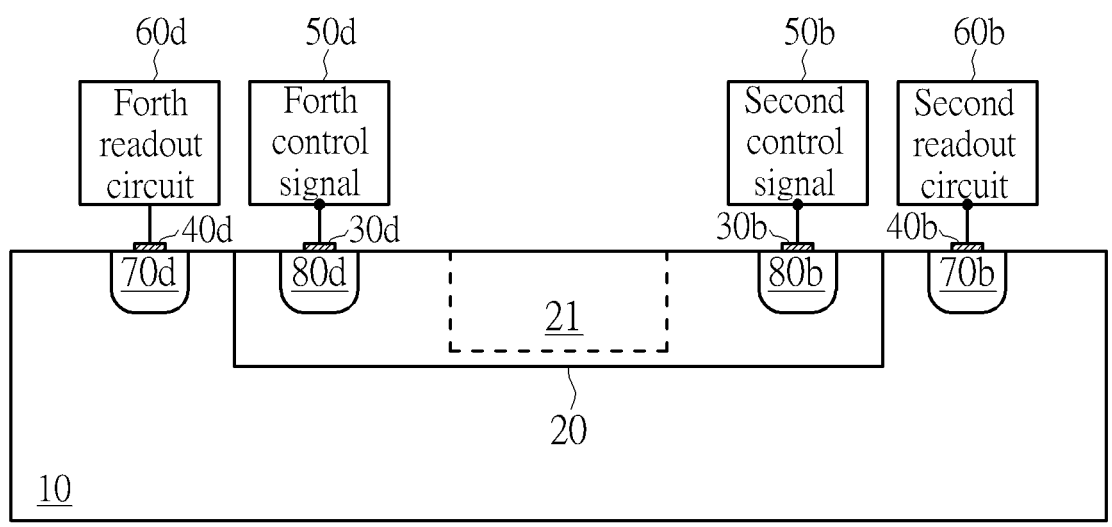
FIG. 15B shows the cross-sectional view along the second axis of symmetry S2 in FIG. 15A.

Please refer to FIGS. 15A-15B. FIG. 15A shows the top view of a pixel of n optoelectronic device according to an embodiment of the present disclosure, and FIG. 15B shows the cross-sectional view along the second symmetric axis S2 of FIG. 15A. The cross-sectional view along the first axis of symmetry S1 of FIG. 15A is similar to the structure shown in FIG. 14B, and is omitted here for brevity. The pixel of an optoelectronic device in FIG. 15A-15B is similar to the pixel of an optoelectronic device in FIG. 4D-4E, where the difference is described below.

In this embodiment, the control contact layers 30a, 30b, 30c and 30d, the readout contact layers 40a and 40c are formed on the light-absorption region 20, while the readout contact layers 40b and 40d are on the substrate 10. The carrier collection regions 70b, 70d are in the substrate 10.

Figure 16A:
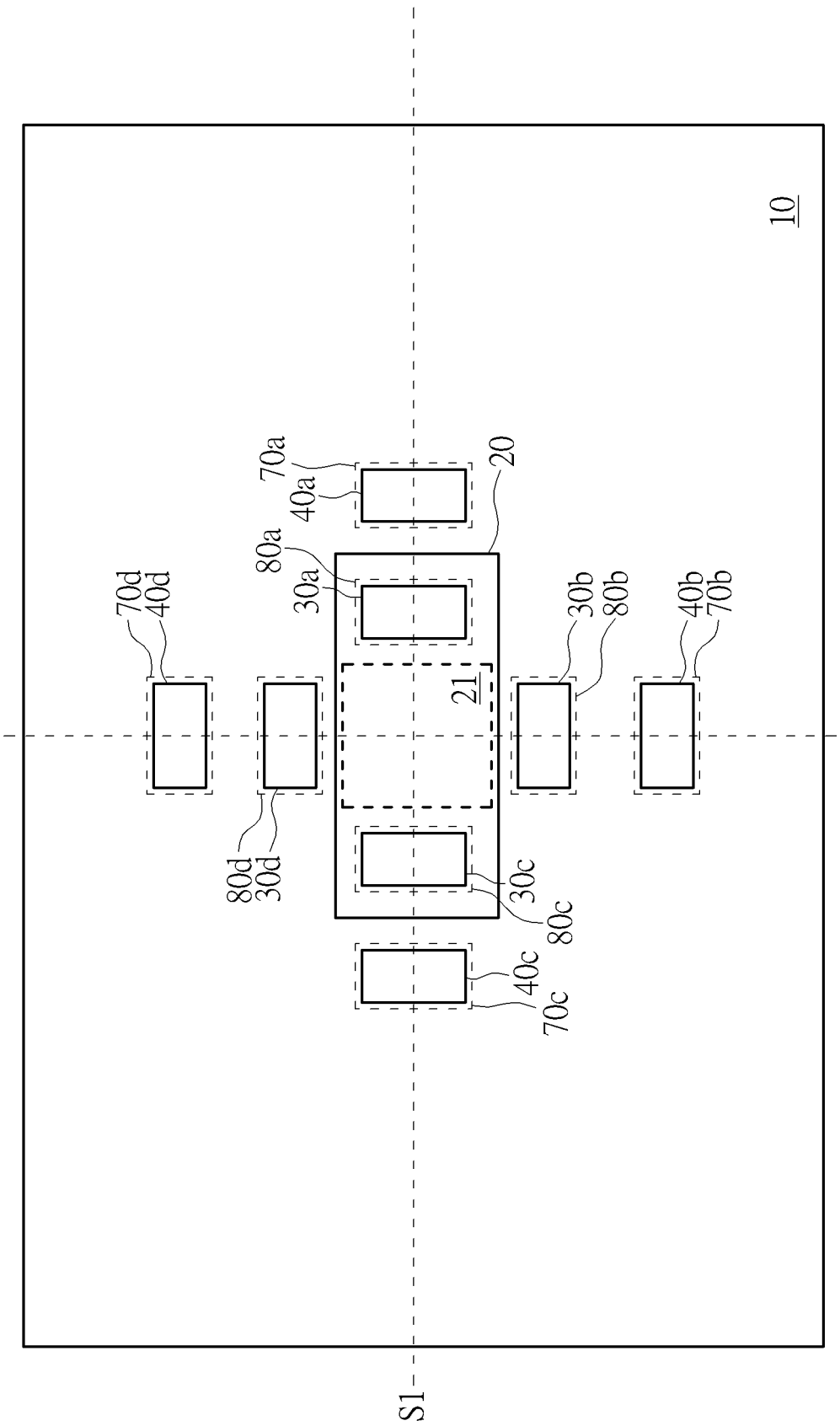
FIG. 16A shows the top view of a pixel of an optoelectronic device according to an embodiment of the present disclosure.
Figure 16B:
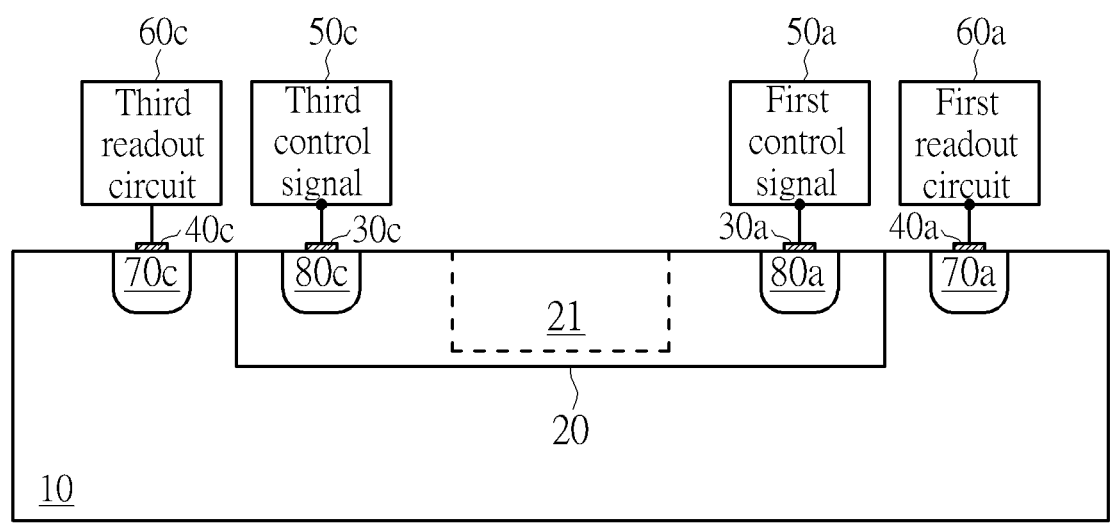
FIG. 16B shows the cross-sectional view along the first axis of symmetry S1 in FIG. 15A.

Please refer to FIGS. 16A-16B. FIG. 16A shows the top view of a pixel of an optoelectronic device according to an embodiment of the present disclosure, FIG. 16B shows the cross-sectional view along the first axis of symmetry S1 of FIG. 16A, and the cross-sectional view along the second symmetric axis S2 of FIG. 16A is similar to the structure shown in FIG. 14C and thus is omitted here for brevity. The pixel of the optoelectronic devices shown in FIGS. 16A-16B is similar to the pixel of the optoelectronic devices shown in FIGS. 4D-4E, where the difference is described below.

In this embodiment, the control contact layers 30b and 30d and the readout contact layers 40a-40d are formed on the substrate 10, while the control contact layers 30a and 30c are formed on the light-absorption region 20. The carrier collection regions 70b-70d, and the carrier control regions 80b, 80d are in the substrate 10.

The present disclosure provides various technical effects. For example, instead of using 2 control signals coupled to a photodetector, one may use 4 control signals coupled to a photodetector. Hence, a 2×4 data set in the 2-tap scheme can be effectively replaced with a 4×2 data set in the 4-tap scheme. As a result, some spatial resources are doubled, (e.g. the tap portion of a pixel region), while some temporal resources are halved (e.g. the reset number and frame time). In addition, since the photodetector portion of a pixel is compatible with both the 2-tap and 4-tap schemes, the overall system can benefit from replacing the 2-tap scheme with the 4-tap scheme. To summarize, the novel solution provided by the present disclosure is capable of reducing signal reset number and frame time.

In some embodiments, the optoelectronic device in the present disclosure further includes an optical element (not shown) over the pixel. In some embodiments, the optoelectronic device in the present disclosure further includes multiple optical elements (not shown) over the multiple pixels in a one-to-one correlation. The optical element converges an incoming optical signal to enter the absorbed region. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous In the present disclosure, if not specifically mention, the light-absorption region 20 is entirely embedded in the substrate 10, partially embedded in the substrate 10 or entirely over the top surface of the substrate 10.

In the present disclosure, the optoelectronic device may be a photodetecting device, wherein the light-absorption region 20 is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the absorption layer receives an optical signal and converts the optical signal into electrical signals.

In the present disclosure, the light-absorption region 20 includes a material different from a material of the substrate 10. In some embodiments, the light-absorption region 20 includes a semiconductor material. In some embodiments, the light-absorption region 20 includes polycrystalline material. In some embodiments, the substrate 10 includes a semiconductor material. In some embodiments, the light-absorption region 20 includes a Group III-V semiconductor material. In some embodiments, the substrate 10 includes a Group III-V semiconductor material. The Group III-V semiconductor material may include, but is not limited to GaAs/AlAs, InP/InGaAs, GaSb/InAs, or InSb. In some embodiments, the light-absorption region 20 includes a semiconductor material including a Group IV element. For example, Ge, Si or Sn. In some embodiments, the light-absorption region 20 includes $Ge_xSi_{1-x}$, wherein $0<x<1$. In some embodiments, the absorption layer includes the $Si_xGe_ySn_{1-x-y}$, wherein $0\leq x\leq 1$, $0\leq y\leq 1$. In some embodiments, the light-absorption region 20 includes the $Ge_{1-a}Sn_a$, wherein $0\leq a\leq 0.1$. In some embodiments, the substrate includes Si. In some embodiments, the substrate 10 is composed of Si. In some embodiments, the light-absorption region 20 is composed of germanium. In some embodiments, the light-absorption region 20 composed of intrinsic germanium is of p-type due to material defects formed during formation of the light-absorption region 20, wherein the defect density is from $1\times 10^{14}$ cm$^{-3}$ to $1\times 10^{16}$ cm$^{-3}$.

In the present disclosure, the light-absorption region 20 has a thickness depending on the wavelength of photons to be detected and the material of the light-absorption region 20. In some embodiments, when the light-absorption region 20 includes germanium and is designed to absorb photons having a wavelength not less than 800 nanometer (nm), the light-absorption region 20 has a thickness not less than 0.1 micrometer (μm). In some embodiments, the light-absorption region 20 includes germanium and is designed to absorb photons having a wavelength between 800 nm and 2000 nm, the light-absorption region 20 has a thickness between 0.1 μm and 2.5 μm. In some embodiments, the light-absorption region 20 has a thickness between 1 μm and 2.5 μm for higher quantum efficiency. In some embodiments, the light-absorption region 20 may be grown using a blanket epitaxy, a selective epitaxy, or other applicable techniques.

In the present disclosure, the light shield has the optical window for defining the position of the absorbed region in the light-absorption region 20. In other words, the optical window is for allowing the incident optical signal enter into the light-absorption region 20 and defining the light-absorption area 21. In some embodiments, the light shield is on a bottom surface of the substrate 10 distant from the light-absorption region 20 when an incident light enters the light-absorption region 20 from the bottom surface of the substrate 10. In some embodiments, a shape of the optical window can be ellipse, circle, rectangular, square, rhombus, octagon or any other suitable shape from a top view of the optical window.

In the present disclosure, the collection of the charges by the two switches of a pixel may be altered over time, such that the photodetecting apparatus applied to an imaging system may determine phase information of the sensed light. The imaging system may use the phase information to analyze characteristics associated with the three-dimensional object including depth information or a material composition. The imaging system may also use the phase information to analyze characteristics associated with facial recognition, eye-tracking, gesture recognition, 3-dimensional model scanning/video recording, motion tracking, and/or augmented/virtual reality applications. In some embodiments, the photodetecting apparatus is configured for time-of-flight detection. The imaging system may be a mobile device (e.g. a smartphone or a tablet), an ancillary device (e.g. a wearable device) for a mobile device, a computing system on a vehicle or in a fixed facility (e.g. a factory), a robotics system, or any other suitable device and/or system. In some embodiments, an imaging system may include one or more optical modules. For example, an optical module may include one or more cameras that are integrated with the photodetecting apparatus. As another example, one optical module of an imaging system may include one or more cameras, and another optical module of the imaging system may include a photodetecting apparatus having a one-dimensional or a two-dimensional array of pixels implemented for time-of-flight detection.

In the present disclosure, in some embodiments, one of the control signals may be fixed at a voltage value Vi, and the other control signals may alternate between voltage values Vi±ΔV. In some embodiments, the 2M control signals may be voltages that are differential to each other. In the present disclosure, one of the control signals is a constant voltage signal (e.g. 0.5V) and the other control signals are a time-varying voltage signal (e.g. sinusoid signal, clock signal or pulse signal operated between 0V and 1V). The direction of the bias value determines the drift direction of the charges generated from the light-absorption region 20.

In the present disclosure, if not specifically mention, in a same pixel, the type of the carriers collected by the carrier collection region of one of the switches and the type of the carriers collected by the carrier collection region of another switch are the same. For example, when the optoelectronic device is configured to collects electrons, when the first switch is switched on and the other switches are switched off, the carrier collection region of the first switch collects electrons of the photo-carriers generated from the light-absorption region 20, and when the second switch is switched on and the other switches are switched off, the carrier collection region of the second switch also collects electrons of the photo-carriers generated from the light-absorption region 20.

In the present disclosure, if not specifically mention, the readout contact layers 40a-40d, the control contact layers 30a-30d and the conductive layer and include metals or alloys. For example, the readout contact layers 40a-40d, the control contact layers 30a-30d may include Al, Cu, W, Ti, Ta—TaN—Cu stack or Ti—TiN—W stack. In some embodiments, the readout contact layers 40a-40d and the control contact layers 30a-30d include metal silicide or metal germanide. Metal Silicide includes, but is not limited to nick silicide.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optoelectronic device, comprising:
a photodetector comprising a light-absorption region, 2N control contact layers electrically coupled to the light-absorption region, 2N readout contact layers electrically coupled to the light-absorption region, 2N carrier control regions each located under a corresponding control contact layer, and comprising 2N carrier collection regions each located under a corresponding 2N readout contact layer, wherein each of the 2N carrier collection regions is of a first conductivity type different from a second conductivity type of each of the 2N carrier control regions; and
2N readout circuits, each electrically coupled a corresponding control contact layer, wherein N is a positive integer larger than or equal to 2.

2. The optoelectronic device of claim 1, wherein the light-absorption region comprises a first axis of symmetry, and one of the 2N control contact layers at one side of the first axis of symmetry is symmetric to another one of said 2N control contact layers at the other side of the first axis of symmetry.

3. The optoelectronic device of claim 2, wherein the light-absorption region comprises a second axis of symmetry, and one of said 2N carrier control contact layers at one side of the second axis of symmetry is symmetric to another one of said 2N carrier control contact layers at the other side of the second axis of symmetry; and the second axis of symmetry is substantially perpendicular to the first axis of symmetry.

4. The optoelectronic device of claim 1, further comprising 2M control signals different from one another and electrically coupled to the photodetector, 2≤M≤N, M is a positive integer, and each of said 2M control signal are arranged to control at least one of said 2N control contact layers.

5. The optoelectronic device of claim 4, wherein a phase of each of 2M control signals is not overlapped by the phase of one another.

6. The optoelectronic device of claim 4, wherein each of the 2M control signals comprises a clock pulse, a phase difference between the clock pulse of x-th control signal and the clock pulse of (x+1)-th control signal is at least 360/2M degrees.

7. The optoelectronic device of claim 6, wherein a duty cycle of each of the clock pulses of the x-th control signal and the (x+1)-th control signal is equal to or less than 1/2M.

8. The optoelectronic device of claim 1, wherein the photodetector further comprises 2N first counter-doped regions, wherein each of said 2N first counter-doped regions overlaps with at least a portion of a corresponding carrier control region.

9. The optoelectronic device of claim 8, wherein the photodetector further comprises 2N second counter-doped regions, each of the 2N second counter-doped regions overlaps with at least a portion of a corresponding carrier collection region.

10. The optoelectronic device of claim 1, wherein the photodetector further comprises a doped region in the light-absorption region and of a third conductivity type that is a same type as the first conductivity type.

11. The optoelectronic device of claim 1, further comprising a light-absorption area in the light-absorption region, wherein the 2N readout contact layers are symmetric relative to the light-absorption area.

12. The optoelectronic device of claim 11, wherein the 2N control contact layers are symmetric relative to the light-absorption area.

13. The optoelectronic device of claim 1, further comprising a substrate supporting the photodetector, wherein at least one of the 2N readout contact layers or at least one of the 2N control contact layers are is on the substrate.

14. The optoelectronic device of claim 1, further comprising a substrate supporting the photodetector, wherein the 2N readout contact layers and the 2N control contact layers are on the substrate.

15. The optoelectronic device of claim 1, further comprising a light-absorption area in the light-absorption region and defined by a light shield, wherein the light-absorption area is hexagonal.

16. The optoelectronic device of claim 1, wherein the light-absorption region comprises germanium.

17. The optoelectronic device of claim 1, wherein photodetector further comprises a blocking layer surrounding at least a part of the light-absorption region, wherein the blocking layer is of the second conductivity type.

* * * * *